United States Patent
Matsumoto et al.

(10) Patent No.: US 11,621,739 B2
(45) Date of Patent: Apr. 4, 2023

(54) RADIO-FREQUENCY MODULE AND COMMUNICATIONS DEVICE

(71) Applicant: Murata Manufacturing Co., Ltd., Nagaokakyo (JP)

(72) Inventors: Naoya Matsumoto, Nagaokakyo (JP); Yoichi Sawada, Nagaokakyo (JP)

(73) Assignee: MURATA MANUFACIURING CO., LTD., Nagaokakyo (JP)

( * ) Notice: Subject to any disclaimer, the term of this patent is extended or adjusted under 35 U.S.C. 154(b) by 113 days.

(21) Appl. No.: 17/204,967

(22) Filed: Mar. 18, 2021

(65) Prior Publication Data
US 2021/0297108 A1 Sep. 23, 2021

(30) Foreign Application Priority Data
Mar. 19, 2020 (JP) .............................. JP2020-049824

(51) Int. Cl.
| | |
|---|---|
| *H04B 1/40* | (2015.01) |
| *H04B 1/00* | (2006.01) |
| *H03H 9/64* | (2006.01) |
| *H03H 9/72* | (2006.01) |

(52) U.S. Cl.
CPC ............. *H04B 1/40* (2013.01); *H03H 9/6483* (2013.01); *H03H 9/725* (2013.01); *H04B 1/0057* (2013.01)

(58) Field of Classification Search
CPC ............. H03H 9/02574; H03H 9/0542; H03H 9/0552; H03H 9/059; H03H 9/1071; H03H 9/6483; H03H 9/725; H04B 1/0057; H04B 1/40
USPC .................................................. 333/133, 186
See application file for complete search history.

(56) References Cited

U.S. PATENT DOCUMENTS

| | | | | |
|---|---|---|---|---|
| 6,262,513 B1 | * | 7/2001 | Furukawa ............ | H03H 9/6436 257/E23.128 |
| 9,035,721 B2 | * | 5/2015 | Takenoshita ........... | H03H 9/725 333/133 |
| 2011/0109400 A1 | * | 5/2011 | Koga .................... | H03H 9/0576 333/186 |
| 2013/0307639 A1 | * | 11/2013 | Mori ...................... | H03H 9/725 333/133 |
| 2018/0198436 A1 | * | 7/2018 | Joshi ...................... | H03H 9/706 |
| 2019/0115309 A1 | * | 4/2019 | Modi .................... | H01L 23/552 |
| 2020/0211998 A1 | * | 7/2020 | Uejima ................... | H01L 24/49 |
| 2020/0295734 A1 | * | 9/2020 | Urata .................... | H03H 9/059 |
| 2021/0091796 A1 | * | 3/2021 | Shinozaki ............ | H04B 1/0053 |
| 2021/0135695 A1 | * | 5/2021 | Uejima .................. | H04B 1/006 |

(Continued)

FOREIGN PATENT DOCUMENTS

WO 2018/110393 A1 6/2018

*Primary Examiner* — Tan H Trinh
(74) *Attorney, Agent, or Firm* — Xsensus LLP

(57) ABSTRACT

A radio-frequency module includes a mount board, an electronic component, an external connection terminal, and an acoustic wave filter. The mount board has a first principal surface and a second principal surface facing each other. The electronic component is arranged on the first principal surface of the mount board. The external connection terminal is arranged on the second principal surface of the mount board. The acoustic wave filter is arranged on the second principal surface of the mount board. The acoustic wave filter is a bare-chip acoustic wave filter. The radio-frequency module is suppressed in height along a thickness of the mount board.

19 Claims, 13 Drawing Sheets

(56) References Cited

U.S. PATENT DOCUMENTS

| | | | | |
|---|---|---|---|---|
| 2021/0242589 A1* | 8/2021 | Pannicke | ............ | H01F 17/0013 |
| 2021/0399758 A1* | 12/2021 | Yamaguchi | ............. | H01L 23/02 |
| 2021/0409046 A1* | 12/2021 | Yamaguchi | .............. | H04B 1/18 |
| 2022/0102296 A1* | 3/2022 | Kitajima | .............. | H01Q 1/2283 |
| 2022/0123774 A1* | 4/2022 | Tsuda | ....................... | H04B 1/38 |

* cited by examiner

RADIO-FREQUENCY MODULE AND COMMUNICATIONS DEVICE

CROSS-REFERENCE TO RELATED APPLICATION

The present application is based upon, and claims the benefit of priority to, Japanese Patent Application No. 2020-049824, filed on Mar. 19, 2020, the entire contents of which is incorporated herein by reference.

TECHNICAL FIELD

The present disclosure generally relates to a radio-frequency (RF) module and a communications device, and more particularly relates to an RF module including a mount board, and an acoustic wave filter and a communications device including such an RF module.

BACKGROUND ART

A front-end module is known as an RF module which includes a board (mount board), a filter unit provided on the board, a switch IC that also provided on the board, and an amplifier unit (see, for example, WO 2018/110393 A1).

In the exemplary front-end module of WO 2018/110393 A1, the filter unit is provided on one principal surface of the board, and the switch IC is provided on the other principal surface of the board.

The front-end module further includes a plurality of electrodes (external connection terminals) provided on the other principal surface of the board.

WO 2018/110393 A1 also discloses a communications device including an RF signal processor circuit for processing an RF signal transmitted from, and received at, an antenna element and the front-end module.

RF modules are sometimes required, when its mount board is designed to be downsized by mounting respective components on one and the other principal surfaces thereof, to have its height reduced along the thickness of the mount board.

SUMMARY

The present disclosure provides an RF module which may have its height reduced along the thickness of its mount board and a communications device including such an RF module.

A radio-frequency module according to an aspect of the present disclosure includes a mount board, an electronic component, an external connection terminal, and an acoustic wave filter. The mount board has a first principal surface and a second principal surface on opposite sides of the mount board. The electronic component is arranged on the first principal surface of the mount board. The external connection terminal is arranged on the second principal surface of the mount board. The acoustic wave filter is arranged on the second principal surface of the mount board. The acoustic wave filter is a bare-chip acoustic wave filter.

A communications device according to another aspect of the present disclosure includes the radio-frequency module described above and a signal processor circuit. The signal processor circuit performs signal processing on a radio-frequency signal passing through the bare-chip acoustic wave filter of the radio-frequency module.

The radio-frequency module and communications device according to these aspects of the present disclosure contributes to providing a radio-frequency module and communications device, of which the height is reduced along the thickness of their mount board.

DETAILED DESCRIPTION

Note that FIGS. 2-6, FIG. 8, and FIGS. 10-13 to be referred to in the following description of embodiments are all schematic representations. That is to say, the ratio of the dimensions (including thicknesses) of respective constituent elements illustrated on the drawings does not always reflect their actual dimensional ratio.

First Embodiment

Figure 1:
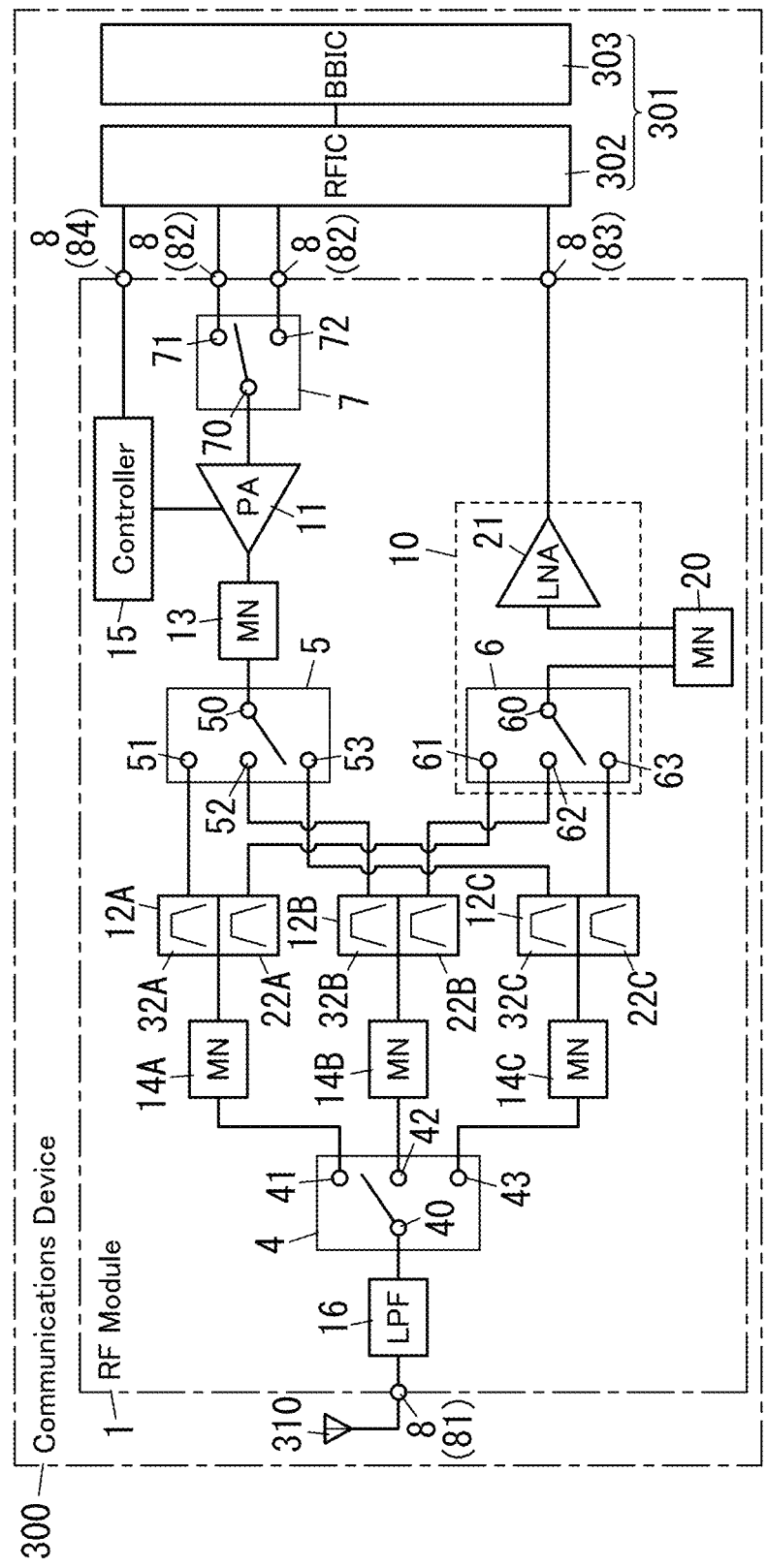
FIG. 1 is a circuit diagram of an RF module (or RF front-end circuitry) according to a first embodiment and a communications device including the RF module.

A radio-frequency (RF) module 1 and communications device 300 according to a first embodiment will be described with reference to FIGS. 1-3.

(1) RF Module and Communications Device (1.1) Overview of RF Module and Communications Device A circuit configuration for the RF module 1 and communications device 300 according to a first embodiment will be described with reference to FIG. 1.

The RF module 1 according to the first embodiment may be used, for example, in the communications device 300. The communications device 300 is typically implemented as a transceiver device, such as cellphone (such as a smartphone), for example. However, this is only an example of the present disclosure and should not be construed as limiting. Alternatively, the communications device 300 may also be a wearable terminal (such as a smart watch). The RF module 1 is a module compliant with, for example, the fourth generation (4G) mobile communications standard or the fifth generation (5G) mobile communications standard. The 4G standard may be, for example, 3GPP long term evolution (LTE) standard. The 5G standard may be, for example, 5G new radio (NR) standard. The RF module 1 is a module compatible with carrier aggregation and dual connectivity, for example.

The RF module 1 is configured to amplify (power amplify) a transmission signal (RF signal) provided by a signal processor circuit 301, for example, and output the amplified signal to an antenna 310. While the term "circuit" is used herein, it should be recognized that circuitry (one or more circuits) may be equally applicable because more than one circuits may be used in implement the described function. In addition, the RF module 1 is also configured to amplify (low-noise amplify) a reception signal (RF signal) provided by the antenna 310 and output the amplified signal to the signal processor circuit 301. Note that the signal processor circuit 301 is not a constituent element of the RF module 1, but a constituent element of the communications device 300 including the RF module 1. The RF module 1 according to the first embodiment may be controlled, for example, by the signal processor circuit 301 included with the communications device 300. That is to say, the communications device 300 includes the RF module 1 and the signal processor circuit 301. The communications device 300 further includes the antenna 310. The communications device 300 further includes a circuit board on which the RF module 1 is implemented. The circuit board may be a printed wiring board, for example. The circuit board includes a ground electrode to which a ground potential is applied.

The signal processor circuit 301 may include, for example, an RF signal processor circuit 302 and a baseband signal processor circuit 303. The RF signal processor circuit 302 may be implemented as, for example, a radio frequency integrated circuit (RFIC) and performs signal processing on an RF signal. Specifically, the RF signal processor circuit 302 performs signal processing such as up conversion on an RF signal (transmission signal) provided by the baseband signal processor circuit 303, for example, and outputs the RF signal subjected to the signal processing. In addition, the RF signal processor circuit 302 also performs signal processing such as down conversion on an RF signal (reception signal) provided by the RF module 1, for example, and outputs the RF signal subjected to the signal processing to the baseband signal processor circuit 303. The baseband signal processor circuit 303 may be implemented as, for example, a baseband integrated circuit (BBIC). The baseband signal processor circuit 303 generates an I-phase signal and a Q-phase signal based on a baseband signal. The baseband signal may be an externally input signal such as an audio signal or an image signal. The baseband signal processor circuit 303 performs IQ modulation processing by synthesizing the I-phase signal and the Q-phase signal together to output the transmission signal. In this case, the transmission signal is generated as a modulated signal (IQ signal) obtained by subjecting a carrier wave signal with a predetermined frequency to amplitude modulation at a cycle time longer than the cycle time of the carrier wave signal. The reception signal processed by the baseband signal processor circuit 303 may be used as an image signal to display an image or as an audio signal allowing the user to speak. The RF module 1 transfers the RF signals (including the reception signal and the transmission signal) between the antenna 310 and the RF signal processor circuit 302 of the signal processor circuit 301.

The RF module 1 according to the first embodiment includes a power amplifier 11, two or more (e.g., three) filters 32A-32C, a first switch 5, a second switch 4, and an antenna terminal 81. The power amplifier 11 amplifies the RF signal provided by the signal processor circuit 301 and outputs the RF signal thus amplified. The first switch 5 includes a common terminal 50 and a plurality of (e.g., three) select terminals 51-53. The power amplifier 11 is connected to the common terminal 50. The three filters 32A-32C are respectively connected to the three select terminals 51-53 of the first switch 5. The second switch 4 also includes a common terminal 40 and a plurality of (e.g., three) select terminals 41-43. The three filters 32A-32C are respectively connected to the three select terminals 41-43. The antenna terminal 81 is connected to the common terminal 40 of the second switch 4.

The RF module 1 according to the first embodiment further includes an output matching circuit 13 provided between the power amplifier 11 and the common terminal 50 of the first switch 5. The RF module 1 further includes three matching circuits 14A-14C, each of which is provided on its signal path between an associated one of the three filters 32A-32C and the second switch 4. The RF module 1 further includes a controller 15. The controller 15 controls the power amplifier 11. The RF module 1 further includes a plurality of (e.g., two) signal input terminals 82, to which the input terminal of the power amplifier 11 is connected, and a control terminal 84 to which the controller 15 is connected.

In the RF module 1, each of the three filters 32A-32C is implemented as a duplexer. The RF module 1 according to the first embodiment further includes a third switch 6, a low-noise amplifier 21, and an input matching circuit 20. The third switch 6 includes a common terminal 60 and a plurality of (e.g., three) select terminals 61-63. The low-noise amplifier 21 is connected to the common terminal 60. The input matching circuit 20 is provided between the third switch 6 and the low-noise amplifier 21. The RF module 1 further includes a signal output terminal 83, to which the output terminal of the low-noise amplifier 21 is connected.

The RF module 1 according to the first embodiment further includes a low-pass filter 16 and a fourth switch 7. The low-pass filter 16 is connected between the antenna terminal 81 and the common terminal 40 of the second switch 4. The fourth switch 7 is connected between the power amplifier 11 and the two signal input terminals 82. The fourth switch 7 includes a common terminal 70 and a plurality of (e.g., two in the example illustrated in FIG. 1) select terminals 71, 72. The power amplifier 11 is connected to the common terminal 70. The two signal input terminals 82 are respectively connected to the two select terminals 71, 72.

Figure 2:
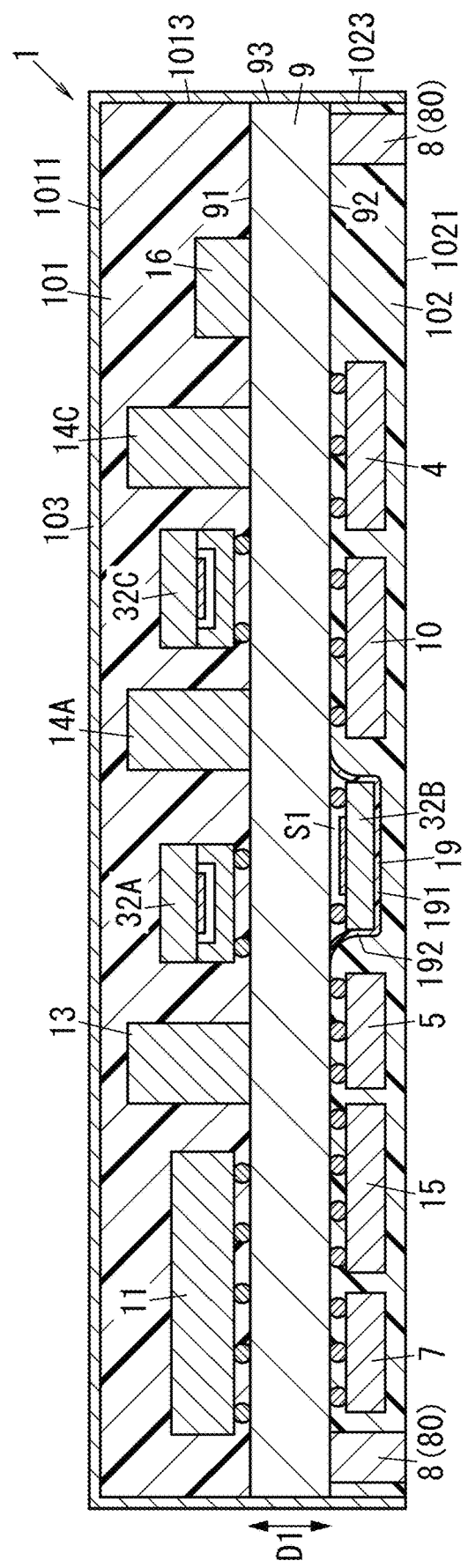
FIG. 2 is a cross-sectional view of the RF module.
Figure 3:
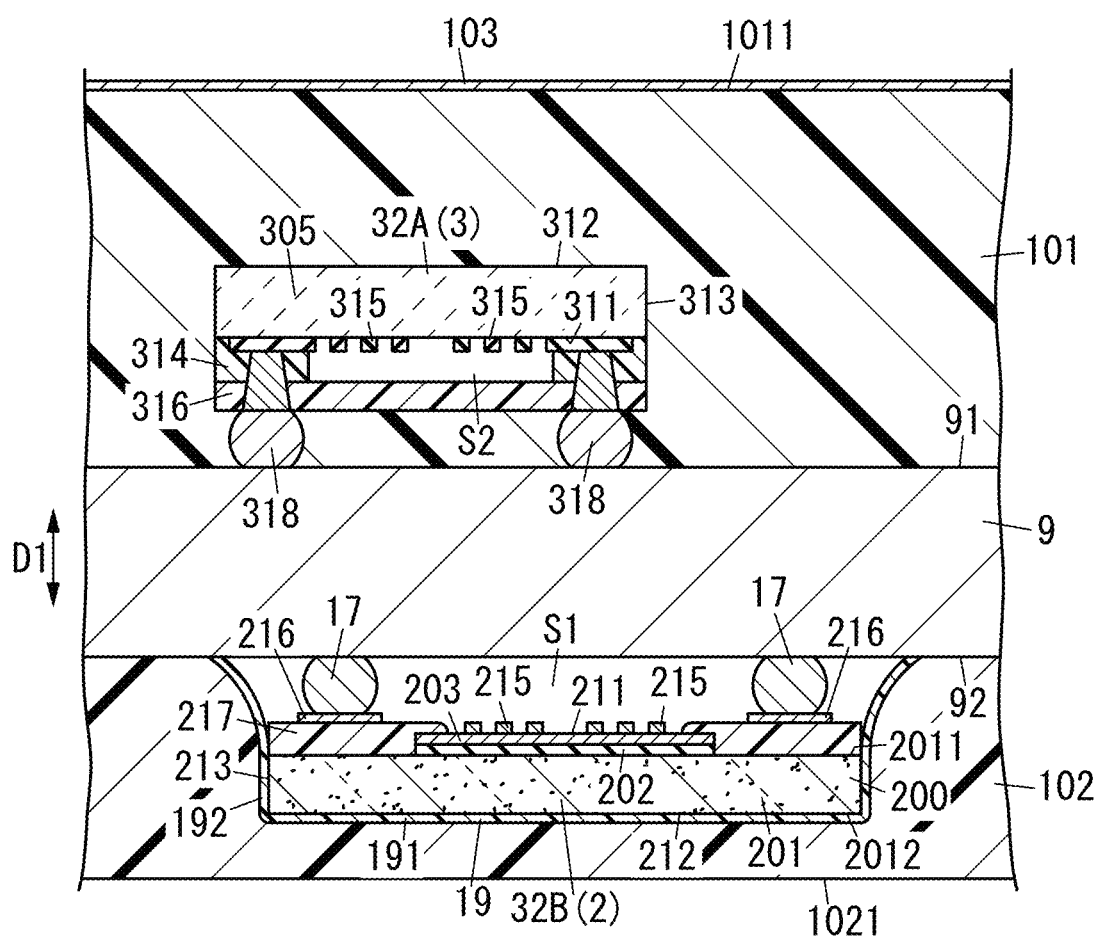
FIG. 3 is a cross-sectional view of a part of the RF module.

The RF module 1 according to the first embodiment includes: a mount board 9 having a first principal surface 91 and a second principal surface 92 on opposite sides of the mount board 9; electronic components (such as the power amplifier 11, the filters 32A, 32C, the output matching circuit 13, the matching circuits 14A-14C, and the low-pass filter 16) arranged on the first principal surface 91 of the mount board 9; the external connection terminal 8; and an acoustic wave filter 2 (also referred to as filter 32B) as shown in FIGS. 2 and 3. The external connection terminal 8 is arranged on the second principal surface 92 of the mount board 9. The acoustic wave filter 2 is arranged on the second principal surface 92 of the mount board 9. The acoustic wave filter 2 is implemented as a bare chip, as a discrete component that is not encapsulated in a package, sometimes referred to as a bare die. This bare chip configuration allows the RF module 1 according to the first embodiment to have its height reduced along the thickness D1 of the mount board 9. Since the acoustic wave filter 2 arranged on the second principal surface 92 of the mount board 9 is a bare chip, the RF module 1 according to the first embodiment may have its height on the second principal surface 92 of the mount board 9 reduced along the thickness D1 of the mount board 9, thus contributing to reducing the overall height of the RF module 1.

(1.2) Respective Constituent Elements of RF Module with this Circuit Configuration (1.2.1) Power Amplifier The power amplifier 11 amplifies the transmission signal (RF signal) provided by the signal processor circuit 301, for example, and outputs the signal thus amplified. The power amplifier 11 amplifies the input transmission signal falling within a predetermined frequency band and outputs the signal thus amplified. As used herein, the predetermined frequency band includes, for example, a first communications band, a second communications band, and a third communications band. The first communications band corresponds to a transmission signal that passes through (the transmission filter 12A of) the filter 32A. The second communications band corresponds to a transmission signal that passes through (the transmission filter 12B of) the filter 32B. The third communications band corresponds to a transmission signal that passes through (the transmission filter 12C of) the filter 32C. The first communications band corresponds to the transmission signal that passes through the transmission filter 12A and may be Band 1 according to the 3GPP LTE standard, for example. The second communications band corresponds to the transmission signal that passes through the transmission filter 12B and may be Band 3 according to the 3GPP LTE standard, for example. The third communications band corresponds to the transmission signal that passes through the transmission filter 12C and may be either Band 41 according to the 3GPP LTE standard or n41 according to the 5G NR standard, for example.

The power amplifier 11 has an input terminal and an output terminal. The input terminal of the power amplifier 11 is connected to the two signal input terminals 82. More specifically, the input terminal of the power amplifier 11 is connected to the two signal input terminals 82 via the fourth switch 7. The input terminal of the power amplifier 11 may be connected to the signal processor circuit 301 via any one of the two signal input terminals 82. The signal input terminals 82 are terminals for inputting an RF signal (transmission signal) provided by an external circuit (such as the signal processor circuit 301) to the RF module 1. The output terminal of the power amplifier 11 is connected to the output matching circuit 13.

The input terminal of the power amplifier 11 is connected to the signal processor circuit 301 via the signal input terminals 82. The output terminal of the power amplifier 11 is connected to the common terminal 50 of the first switch 5 via the output matching circuit 13. The power amplifier 11 is controlled by the controller 15.

(1.2.2) Filter

The filter 32A is implemented as a duplexer and includes the transmission filter 12A and a reception filter 22A. The filter 32B is implemented as a duplexer and includes the transmission filter 12B and a reception filter 22B. The filter 32C is implemented as a duplexer and includes the transmission filter 12C and a reception filter 22C.

The transmission filter 12A is a filter, of which the pass band may be defined by, for example, the transmission band of the first communications band. The transmission filter 12B is a filter, of which the pass band may be defined by, for example, the transmission band of the second communications band. The transmission filter 12C is a filter, of which the pass band may be defined by, for example, the transmission band of the third communications band.

The reception filter 22A is a filter, of which the pass band may be defined by, for example, the reception band of the first communications band. The reception filter 22B is a filter, of which the pass band may be defined by, for example, the reception band of the second communications band. The reception filter 22C is a filter, of which the pass band may be defined by, for example, the reception band of the third communications band.

(1.2.3) First Switch

The first switch 5 has the common terminal 50 and the three select terminals 51-53. The common terminal 50 is connected to the output terminal of the power amplifier 11 via the output matching circuit 13. The select terminal 51 is connected to the filter 32A. More specifically, the select terminal 51 is connected to the input terminal of the transmission filter 12A (i.e., a transmission terminal of a duplexer functioning as the filter 32A). The select terminal 52 is connected to the filter 32B. More specifically, the select terminal 52 is connected to the input terminal of the transmission filter 12B (i.e., a transmission terminal of a duplexer functioning as the filter 32B). The select terminal 53 is connected to the filter 32C. More specifically, the select terminal 53 is connected to the input terminal of the transmission filter 12C (i.e., a transmission terminal of a duplexer functioning as the filter 32C). The first switch 5 is a switch, of which at least one of the three select terminals 51-53 is connectible to the common terminal 50, for example. In this embodiment, the first switch 5 is a switch that allows both one-to-one connection and one-to-multiple connection, for example. The first switch 5 is a switch having the capability of switching signal paths for multiple transmission signals with mutually different communications bands and will be hereinafter referred to as a "band select switch."

The first switch 5 is controlled by an external circuit (such as the signal processor circuit 301) provided outside of the RF module 1. The first switch 5 changes the state of connection between the common terminal 50 and the three select terminals 51-53 in accordance with a control signal from the signal processor circuit 301, for example. The first switch 5 may be implemented as a switch integrated circuit (IC), for example.

(1.2.4) Second Switch

The second switch 4 has the common terminal 40 and the three select terminals 41-43. The second switch 4 is a switch to be connected to the antenna terminal 81 and will be hereinafter referred to as an "antenna switch." In the second switch 4, the common terminal 40 thereof is connected to the antenna terminal 81. More specifically, the common terminal 40 is connected to the antenna terminal 81 via the low-pass filter 16. The antenna 310 is connected to the antenna terminal 81. The select terminal 41 is connected to the filter 32A. More specifically, the select terminal 41 is connected to the transmission filter 12A and reception filter 22A of the filter 32A. The select terminal 42 is connected to the filter 32B. More specifically, the select terminal 42 is connected to the transmission filter 12B and the reception filter 22B. The select terminal 43 is connected to the filter 32C. More specifically, the select terminal 43 is connected to the transmission filter 12C and the reception filter 22C. The second switch 4 is a switch, of which at least one of the three select terminals 41-43 is connectible to the common terminal 40, for example. In this embodiment, the second switch 4 is a switch that allows both one-to-one connection and one-to-multiple connection, for example.

The second switch 4 is provided for signal paths for the transmission signals and for signal paths for the reception signals. In this RF module 1, the second switch 4 is provided for a signal path for the transmission signal on which the power amplifier 11, the output matching circuit 13, the first switch 5, and the transmission filter 12A are provided. In addition, the second switch 4 is also provided for another signal path for the transmission signal on which the power amplifier 11, the output matching circuit 13, the first switch 5, and the transmission filter 12B are provided. Furthermore, the second switch 4 is further provided for another signal path for the transmission signal on which the power amplifier 11, the output matching circuit 13, the first switch 5, and the transmission filter 12C are provided. Furthermore, the second switch 4 is also provided for another signal path for the reception signal on which the reception filter 22A, the third switch 6, and the low-noise amplifier 21 are provided. Furthermore, the second switch 4 is also provided for still another signal path for the reception signal on which the reception filter 22B, the third switch 6, and the low-noise amplifier 21 are provided. Furthermore, the second switch 4 is also provided for yet another signal path for the reception signal on which the reception filter 22C, the third switch 6, and the low-noise amplifier 21 are provided.

The second switch 4 is controlled by an external circuit (such as the signal processor circuit 301) provided outside of the RF module 1. The second switch 4 changes the state of connection between the common terminal 40 and the three select terminals 41-43 in accordance with a control signal from the signal processor circuit 301, for example. The second switch 4 may be implemented as a switch IC, for example.

(1.2.5) Third Switch

The third switch 6 has the common terminal 60 and the three select terminals 61-63. The common terminal 60 is connected to the input terminal of the low-noise amplifier 21. The select terminal 61 is connected to the filter 32A. More specifically, the select terminal 61 is connected to the output terminal of the reception filter 22A (i.e., a reception terminal of a duplexer functioning as the filter 32A). The select terminal 62 is connected to the filter 32B. More specifically, the select terminal 62 is connected to the output terminal of the reception filter 22B (i.e., a reception terminal of a duplexer functioning as the filter 32B). The select terminal 63 is connected to the filter 32C. More specifically, the select terminal 63 is connected to the output terminal of the reception filter 22C (i.e., a reception terminal of a duplexer functioning as the filter 32C). The third switch 6 is a switch, of which at least one of the three select terminals 61-63 is connectible to the common terminal 60, for example. In this embodiment, the third switch 6 is a switch that allows both one-to-one connection and one-to-multiple connection, for example.

The third switch 6 is controlled by an external circuit (such as the signal processor circuit 301) provided outside of the RF module 1. The third switch 6 changes the state of connection between the common terminal 60 and the three select terminals 61-63 in accordance with a control signal from the signal processor circuit 301, for example.

(1.2.6) Fourth Switch

The fourth switch 7 is connected between the power amplifier 11 and the two signal input terminals 82 to change the state of connection between the power amplifier 11 and the two signal input terminals 82. The fourth switch 7 is controlled by an external circuit (such as the signal processor circuit 301) provided outside of the RF module 1. The fourth switch 7 may be implemented as a switch IC, for example.

(1.2.7) Output Matching Circuit

The output matching circuit 13 is provided between the output terminal of the power amplifier 11 and the common terminal 50 of the first switch 5. The output matching circuit 13 is a circuit for establishing impedance matching between the power amplifier 11 and the filters 32A-32C. The output matching circuit 13 may be implemented as a single inductor, for example. However, this is only an example of the present disclosure and should not be construed as limiting. Alternatively, the output matching circuit 13 may include a plurality of inductors and a plurality of capacitors, for example.

(1.2.8) Matching Circuits

Each of the three matching circuits 14A-14C is a circuit for establishing impedance matching between the antenna 310 and the second switch 4 that are connected to the antenna terminal 81 and an associated one of the plurality of filters 32A-32C. The matching circuit 14A is connected between the select terminal 41 of the second switch 4 and the filter 32A. The matching circuit 14B is connected between the select terminal 42 of the second switch 4 and the filter 32B. The matching circuit 14C is connected between the select terminal 43 of the second switch 4 and the filter 32C.

Each of the three matching circuits 14A-14C may be implemented as a single inductor, for example. However, this is only an example of the present disclosure and should not be construed as limiting. Alternatively, each matching circuit 14A-14C may include a plurality of inductors and a plurality of capacitors, for example.

(1.2.9) Controller

The controller 15 is connected to the power amplifier 11. The controller 15 may be connected to the signal processor circuit 301 via the control terminal 84, for example. The control terminal 84 is a terminal for inputting a control signal from an external circuit (such as the signal processor circuit 301) to the controller 15. The controller 15 controls the power amplifier 11 in accordance with the control signal acquired from the control terminal 84. The controller 15 controls the power amplifier 11 in accordance with a control signal supplied from the RF signal processor circuit 302 of the signal processor circuit 301.

(1.2.10) Low-Noise Amplifier

The low-noise amplifier 21 has an input terminal and an output terminal. The low-noise amplifier 21 is provided on a signal path for the reception signal. The low-noise amplifier 21 receives, at its input terminal, a reception signal falling within the predetermined frequency band, amplifies the reception signal, and then outputs the reception signal thus amplified through its output terminal. The input terminal of the low-noise amplifier 21 is connected to the common terminal 60 of the third switch 6. The output terminal of the low-noise amplifier 21 is connected to the signal output terminal 83. The output terminal of the low-noise amplifier 21 may be connected to the signal processor circuit 301, for example, via the signal output terminal 83. The signal output terminal 83 is a terminal for outputting an RF signal (reception signal) provided by the low-noise amplifier 21 to an external circuit (such as the signal processor circuit 301).

(1.2.11) Input Matching Circuit

The input matching circuit 20 is connected between the input terminal of the low-noise amplifier 21 and the common terminal 60 of the third switch 6. The input matching circuit 20 is a circuit for establishing impedance matching between the low-noise amplifier 21 and the reception filters 22A-22C. The input matching circuit 20 may be implemented as a single inductor, for example. However, this is only an example of the present disclosure and should not be construed as limiting. Alternatively, the input matching circuit 20 may include a plurality of inductors and a plurality of capacitors, for example.

(1.2.12) Low-Pass Filter

The low-pass filter 16 is connected between the antenna terminal 81 and the common terminal 40 of the second switch 4. Alternatively, the RF module 1 may include, instead of the low-pass filter 16, a multiplexer including the low-pass filter 16 (such as a diplexer or a triplexer).

(1.2.13) External Connection Terminals

The RF module 1 includes a plurality of external connection terminals 8. The plurality of external connection terminals 8 includes a plurality of ground terminals 80 (see FIG. 2), the antenna terminal 81, the signal input terminals 82, the signal output terminal 83, and the control terminal 84. The plurality of ground terminals 80 are terminals which are electrically connected to the ground electrode of the circuit board included in the communications device 300 and to which a ground potential is applied.

(1.3) Structure of RF Module

Next, the structure of the RF module 1 will be described with reference to FIG. 2.

The RF module 1 includes a plurality of circuit components and the mount board 9 on which the plurality of circuit components are mounted. The plurality of circuit components are circuit elements of the RF module 1. The plurality of circuit components includes the power amplifier 11 and the acoustic wave filter (filter 32A).

The mount board 9 has the first principal surface 91 and the second principal surface 92 that face each other along the thickness D1 of the mount board 9. Examples of the mount board 9 include a printed wiring board, a low temperature co-fired ceramics (LTCC) board, a high temperature co-fired ceramics (HTCC) board, and a resin multilayer board. In this embodiment, the mount board 9 may be a multilayer board including a plurality of dielectric layers and a plurality of conductive layers, for example. The plurality of dielectric layers and the plurality of conductive layers are stacked one on top of another along the thickness D1 of the mount board 9. Each of the plurality of conductive layers is formed in a predetermined pattern defined on a layer-by-layer basis. Each of the plurality of conductive layers includes a single or a plurality of conductor portions in a plane intersecting at right angles with the thickness D1 of the mount board 9. Each of the conductive layers may be made of copper, for example. The plurality of conductive layers includes a ground layer. In the RF module 1, the plurality of ground terminals 80 and the ground layer are electrically connected through via conductors provided in the mount board 9.

The mount board 9 does not have to be a printed wiring board or an LTCC board but may also be interconnect structure. The interconnect structure may be a multilevel interconnect structure, for example. The multilevel interconnect structure includes at least one insulating layer and at least one conductive layer. The insulating layer is formed in a predetermined pattern. If a plurality of insulating layers are provided, then each of those insulating layers is formed in a predetermined pattern defined on a layer-by-layer basis. The conductive layer is formed in a predetermined pattern which is different from the insulating layer's pattern. If a plurality of conductive layers are provided, then each of those conductive layers is formed in a predetermined pattern defined on a layer-by-layer basis. The conductive layer may include a single or a plurality of re-interconnected portions. In the interconnect structure, a first surface out of two surfaces that face each other along the thickness of the multilevel interconnect structure is the first principal surface 91 of the mount board 9 and a second surface thereof is the second principal surface 92 of the mount board 9. The interconnect structure may be an interposer, for example. The interposer may be an interposer that uses a silicon substrate or a board including multiple layers, whichever is appropriate.

The first principal surface 91 and second principal surface 92 of the mount board 9 are distant from each other along the thickness D1 of the mount board 9 and each intersect with the thickness D1 of the mount board 9. The first principal surface 91 of the mount board 9 may intersect at right angles with the thickness D1 of the mount board 9, for example. Alternatively, the first principal surface 91 may include, as a surface that does not intersect at right angles with the thickness D1, a side surface of a conductor portion, for example. Likewise, the second principal surface 92 of the mount board 9 may intersect at right angles with the thickness D1 of the mount board 9, for example. Alternatively, the second principal surface 92 may include, as a surface that does not intersect at right angles with the thickness D1, a side surface of a conductor portion, for example. Optionally, the first principal surface 91 and second principal surface 92 of the mount board 9 may have microscopic surface unevenness or recesses and/or projections. In this embodiment, when viewed in plan along the thickness D1 of the mount board 9, the mount board 9 has a rectangular shape. However, this is only an example of the present disclosure and should not be construed as limiting. Alternatively, the mount board 9 may also have, for example, a square shape in a plan view.

The RF module 1 includes, as a plurality of circuit components, the power amplifier 11, the first switch 5, the second switch 4, the controller 15, the low-noise amplifier 21, the three filters 32A-32C, the third switch 6, the fourth switch 7, the output matching circuit 13, the input matching circuit 20, the three matching circuits 14A-14C, and the low-pass filter 16. The plurality of circuit components of the RF module 1 are mounted on the mount board 9. As used herein, the phrase "to be mounted on the mount board 9" refers to both a situation where the circuit components are arranged on (i.e., mechanically connected to) the mount board 9 and a situation where the circuit components are electrically connected to (appropriate conductor portions of) the mount board 9. The plurality of circuit components includes not only electronic components mounted on the mount board 9 but also circuit components provided in the mount board 9. Note that illustration of a plurality of interconnects, including the conductor portions and via conductors of the mount board 9 described above, is omitted from FIG. 2.

In this RF module 1, the power amplifier 11 is mounted on the first principal surface 91 of the mount board 9. Thus, the power amplifier 11 is arranged on the first principal surface 91 of the mount board 9.

In addition, in the RF module 1, the output matching circuit 13, the filters 32A, 32C, and the three matching circuits 14A-14C are also mounted on the first principal surface 91 of the mount board 9. Thus, the output matching circuit 13, the filters 32A, 32C, and the three matching circuits 14A-14C are arranged on the first principal surface 91 of the mount board 9.

Furthermore, in the RF module 1, the first switch 5, the second switch 4, the controller 15, and the filter 32B are mounted on the second principal surface 92 of the mount board 9. Thus, in the RF module 1, the first switch 5, the second switch 4, the controller 15, and the filter 32B are arranged on the second principal surface 92 of the mount board 9. Furthermore, in the RF module 1, a single-chip IC chip 10 including the low-noise amplifier 21 and the input matching circuit 20 is mounted on the second principal surface 92 of the mount board 9. Thus, the IC chip 10 is arranged on the second principal surface 92 of the mount board 9.

The power amplifier 11 may be a GaAs-based IC chip with a power amplifier circuit including, as bipolar transistors, heterojunction bipolar transistors (HBTs), for example. The power amplifier 11 is flip-chip bonded onto the mount board 9. When viewed in plan along the thickness D1 of the mount board 9, the power amplifier 11 has a quadrangular outer peripheral shape. The power amplifier 11 does not have to be the GaAs-based IC chip but may also be an Si-based IC chip with a power amplifier circuit or an SiGe-based IC chip with a power amplifier circuit, whichever is appropriate.

A switch IC serving as the first switch 5 is a single-chip IC chip. The first switch 5 includes the common terminal 50, the three select terminals 51-53, and a plurality of field effect transistors (FETs). The first switch 5 is flip-chip bonded onto the second principal surface 92 of the mount board 9. When viewed in plan along the thickness D1 of the mount board 9, the first switch 5 has a quadrangular outer peripheral shape.

A switch IC serving as the second switch 4 is a single-chip IC chip. The second switch 4 includes the common terminal 40, the three select terminals 41-43, and a plurality of FETs. The second switch 4 is flip-chip bonded onto the second principal surface 92 of the mount board 9. When viewed in plan along the thickness D1 of the mount board 9, the second switch 4 has a quadrangular outer peripheral shape.

The third switch 6 includes the common terminal 60, the three select terminals 61-63, and a plurality of FETs. An IC chip 10 including the third switch 6 and the low-noise amplifier 21 is flip-chip bonded onto the second principal surface 92 of the mount board 9. When viewed in plan along the thickness D1 of the mount board 9, the IC chip 10 has a quadrangular outer peripheral shape.

A switch IC serving as the fourth switch 7 is a single-chip IC chip. The fourth switch 7 is flip-chip bonded onto the second principal surface 92 of the mount board 9. When viewed in plan along the thickness D1 of the mount board 9, the fourth switch 7 has a quadrangular outer peripheral shape.

The controller 15 is a single-chip IC chip. The controller 15 is arranged on the second principal surface 92 of the mount board 9. In this embodiment, the controller 15 is flip-chip bonded onto the second principal surface 92 of the mount board 9. When viewed in plan along the thickness D1 of the mount board 9, the controller 15 has a quadrangular outer peripheral shape.

Circuit components that form the output matching circuit 13 include an inductor, for example. The circuit components of the output matching circuit 13 may be arranged on the first principal surface 91 of the mount board 9, for example. The inductor included in the output matching circuit 13 may be, for example, a surface-mount inductor mounted on the first principal surface 91 of the mount board 9. When viewed in plan along the thickness D1 of the mount board 9, the circuit component has a quadrangular outer peripheral shape.

Circuit components that form the input matching circuit 20 include an inductor, for example. The circuit components of the input matching circuit 20 may be arranged on the first principal surface 91 of the mount board 9, for example. When viewed in plan along the thickness D1 of the mount board 9, the circuit component has a quadrangular outer peripheral shape.

Circuit components that form each of the three matching circuits 14A-14C include an inductor, for example. The circuit components of each of the three output matching circuits 14A-14C may be arranged on the first principal surface 91 of the mount board 9, for example. The inductor included in each of the three matching circuits 14A-14C may be, for example, a surface-mount inductor mounted on the first principal surface 91 of the mount board 9. When viewed in plan along the thickness D1 of the mount board 9, the circuit component has a quadrangular outer peripheral shape.

The IC chip 10 including the low-noise amplifier 21 is arranged on the second principal surface 92 of the mount board 9. In this embodiment, the IC chip 10 is flip-chip bonded onto the second principal surface 92 of the mount board 9. The IC chip 10 is arranged, when viewed in plan along the thickness D1 of the mount board 9, not to overlap with the power amplifier 11. When viewed in plan along the thickness D1 of the mount board 9, the IC chip 10 has a quadrangular outer peripheral shape.

The low-pass filter 16 is arranged on the first principal surface 91 of the mount board 9. In this embodiment, the low-pass filter 16 is arranged on the first principal surface 91 of the mount board 9. The low-pass filter 16 may include a plurality of inductors and a plurality of capacitors. The low-pass filter 16 may be implemented as an integrated passive device (IPD), for example.

The plurality of external connection terminals 8 are arranged on the second principal surface 92 of the mount board 9. The plurality of external connection terminals 8 may be made of, for example, a metallic material (such as copper or a copper alloy). Each of the plurality of external connection terminals 8 may be implemented as a columnar electrode. In this embodiment, the columnar electrode may be a circular columnar electrode, for example. In this embodiment, the plurality of external connection terminals 8 have the same shape. However, this is only an example of the present disclosure and should not be construed as limiting. Alternatively, the plurality of external connection terminals 8 may have different shapes as well.

As described above, the plurality of external connection terminals 8 includes the plurality of ground terminals 80, the antenna terminal 81, the signal input terminals 82, the signal output terminal 83, and the control terminal 84. The plurality of ground terminals 80 are electrically connected to the ground layer of the mount board 9 as described above. The ground layer serves as a circuit ground for the RF module 1. The plurality of circuit components of the RF module 1 includes circuit components that are electrically connected to the ground layer.

In the RF module 1 according to the first embodiment, the filter 32B is implemented as a bare-chip acoustic wave filter 2 and each of the filters 32A and 32C is an acoustic wave filter 3 having a package structure. In the following description, the acoustic wave filter 2 will be hereinafter referred to as a "first acoustic wave filter 2" and the acoustic wave filter 3 will be hereinafter referred to as a "second acoustic wave filter 3" for the sake of convenience.

As shown in FIG. 3, the first acoustic wave filter 2 includes a piezoelectric substrate 200, interdigital transducer (IDT) electrodes 215, and a plurality of pad electrodes 216. The piezoelectric substrate 200 has a first principal surface 211 and a second principal surface 212 that face each other. In addition, the piezoelectric substrate 200 also has an outer peripheral surface 213 that connects the first principal surface 211 and the second principal surface 212 together. The IDT electrodes 215 are provided on the first principal surface 211 of the piezoelectric substrate 200. The plurality of pad electrodes 216 are provided over the first principal surface 211 of the piezoelectric substrate 200. The first acoustic wave filter 2 has a rectangular shape when viewed in plan along its thickness. However, this is only an example of the present disclosure and should not be construed as limiting. The first acoustic wave filter 2 may also have a square shape when viewed in plan along its thickness.

The piezoelectric substrate 200 may be a stacked substrate including, for example: a supporting substrate 201; a low acoustic velocity film 202 provided on the supporting substrate 201; and a piezoelectric layer 203 provided on the low acoustic velocity film 202.

The supporting substrate 201 includes a first principal surface 2011 and a second principal surface 2012 that face each other. The low acoustic velocity film 202 is provided on the first principal surface 2011 of the supporting substrate 201. When viewed in plan along the thickness of the first acoustic wave filter 2, the low acoustic velocity film 202 is located at a distance from the outer periphery of the supporting substrate 201. In the first acoustic wave filter 2, the first principal surface 211 of the piezoelectric substrate 200 includes a region, not covered with the low acoustic velocity film 202, of the first principal surface 2011 of the supporting substrate 201 and the other principal surface, facing away from the supporting substrate 201, of the piezoelectric layer 203.

The first acoustic wave filter 2 further includes an insulating layer 217 that covers the region, not covered with the low acoustic velocity film 202, of the first principal surface 2011 of the supporting substrate 201. The insulating layer 217 has electrical insulation properties. The insulating layer 217 is formed on the first principal surface 2011 of the supporting substrate 201 to extend along the outer periphery of the supporting substrate 201. The insulating layer 217 surrounds the plurality of IDT electrodes 215. When viewed in plan along the thickness of the first acoustic wave filter 2, the insulating layer 217 has a frame shape (such as a rectangular frame shape). When viewed along the thickness of the first acoustic wave filter 2, part of the insulating layer 217 overlaps with an outer peripheral portion of the piezoelectric layer 203. The respective outer peripheral surfaces of the piezoelectric layer 203 and low acoustic velocity film 202 are covered with the insulating layer 217. The insulating layer 217 may be made of an epoxy resin, polyimide, or any other suitable material.

The plurality of pad electrodes 216 are provided over the first principal surface 211 of the piezoelectric substrate 200 with the insulating layer 217 interposed between them.

The piezoelectric layer 203 may be made of lithium tantalate or lithium niobate, for example. The low acoustic velocity film 202 is a film that propagates a bulk wave at a lower acoustic velocity than the bulk wave propagating through the piezoelectric layer 203. The low acoustic velocity film 202 may be made of silicon oxide, for example. However, silicon oxide is only an exemplary material for the low acoustic velocity film 202 and should not be construed as limiting. Rather, the low acoustic velocity film 202 may be made of a material selected from the group consisting of: silicon oxide; glass; silicon oxynitride; tantalum oxide; a compound of silicon oxide and fluorine, carbon, or boron; and other materials including any of these materials as a main component thereof. The supporting substrate 201 allows a bulk wave to propagate through the supporting substrate 201 itself at a higher acoustic velocity than an acoustic wave propagating through the piezoelectric layer 203. In this case, the bulk wave propagating through the supporting substrate 201 has a lower acoustic velocity than any other one of a plurality of bulk waves propagating through the supporting substrate 201. A material for the supporting substrate 201 may include at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

Optionally, the piezoelectric substrate 200 may further include a high acoustic velocity film provided between the supporting substrate 201 and the low acoustic velocity film 202. The high acoustic velocity film is a film that propagates a bulk wave at a higher acoustic velocity than an acoustic wave propagating through the piezoelectric layer 203. The high acoustic velocity film may be made of at least one material selected from the group consisting of diamond-like carbon, aluminum nitride, aluminum oxide, silicon carbide, silicon nitride, silicon, sapphire, a piezoelectric material (such as lithium tantalate, lithium niobate, or quartz), alumina, zirconia, cordierite, mullite, steatite, forsterite, magnesia, and diamond. The high acoustic velocity film may also be made of a material including any of these materials as a main component thereof or a material including, as a main component thereof, a mixture including any of these materials.

The piezoelectric substrate 200 does not have to be a stacked substrate but may also be a single-layer substrate of a piezoelectric material, which may be lithium tantalate or lithium niobate, for example. If the piezoelectric substrate 200 is a single-layer substrate of a piezoelectric material, then the plurality of pad electrodes 216 may be formed directly on the first principal surface 211 of the piezoelectric substrate 200.

The first acoustic wave filter 2 includes a plurality of IDT electrodes 215. Note that only two of the plurality of IDT electrodes 215 are shown schematically in FIG. 3. Each of the plurality of IDT electrodes 215 includes a first electrode and a second electrode. The first electrode includes a plurality of first electrode fingers and a first busbar to which the plurality of first electrode fingers are connected. The second electrode includes a plurality of second electrode fingers and a second busbar to which the plurality of second electrode fingers are connected. The characteristic of the first acoustic wave filter 2 may be varied by appropriately changing the electrode finger pitch of the IDT electrodes 215, the intersection width of the IDT electrodes 215, or the material for the piezoelectric substrate 200, for example. The electrode finger pitch of the IDT electrodes 215 may be defined to be either the interval between respective centerlines of two adjacent first electrode fingers out of the plurality of first electrode fingers or the interval between respective centerlines of two adjacent second electrode fingers out of the plurality of second electrode fingers. In the first acoustic wave filter 2 of the RF module 1 according to the first embodiment, each of the transmission filter 12B and the reception filter 22B may be implemented as a ladder filter including a plurality of acoustic wave resonators (including a plurality of series arm resonators and a plurality of parallel arm resonators). Each of the plurality of acoustic wave resonators includes the IDT electrode 215 and a part of the piezoelectric substrate 200.

Optionally, in the first acoustic wave filter 2, the piezoelectric substrate 200 may include a close contact layer interposed between the low acoustic velocity film 202 and the piezoelectric layer 203, for example. The close contact layer may be made of a resin (such as an epoxy resin or a polyimide resin), for example. In addition, in the first acoustic wave filter 2, the piezoelectric substrate 200 may include a dielectric film, which is provided between the low acoustic velocity film 202 and the piezoelectric layer 203, on the piezoelectric layer 203, or under the low acoustic velocity film 202. The dielectric film may be made of silicon oxide, for example. Optionally, the first acoustic wave filter 2 may further include a protective coating provided over the piezoelectric layer 203 and covering the plurality of IDT electrodes 215. The protective coating may be made of silicon oxide, for example.

The first acoustic wave filter 2 is arranged on the second principal surface 92 of the mount board 9. In the first acoustic wave filter 2, the first principal surface 211 of the piezoelectric substrate 200 faces the mount board 9, while the second principal surface 212 of the piezoelectric substrate 200 faces away from the mount board 9. The RF module 1 further includes a plurality of bumps 17, the bumps 17 being conductive bumps that include a conductive material such as solder or gold. The plurality of bumps 17 are interposed between the first acoustic wave filter 2 and the second principal surface 92 of the mount board 9 to connect the first acoustic wave filter 2 to the mount board 9. Each of the plurality of bumps 17 has a generally spherical shape. Each of the plurality of bumps 17 may be a solder bump, for example. However, this is only an example of the present disclosure and should not be construed as limiting. Each of the plurality of bumps 17 does not have to be a solder bump but may also be a gold bump, for example.

The plurality of bumps 17 are bonded to the plurality of pad electrodes 216 and the mount board 9. Each of the plurality of bumps 17 is bonded to an associated pad electrode 216, overlapping with the bump 17 when viewed along the thickness D1 of the mount board 9, out of the plurality of pad electrodes 216. In this RF module 1, a space S1 is created, along the thickness D1 of the mount board 9, between the first acoustic wave filter 2 and the second principal surface 92 of the mount board 9. In the RF module 1 according to the first embodiment, the space S1 is formed between the piezoelectric substrate 200 and the mount board 9 by the plurality of pad electrodes 216, the plurality of bumps 17, the piezoelectric substrate 200, and the mount board 9. The plurality of IDT electrodes 215 are arranged in the space S1.

The second acoustic wave filter 3 includes a piezoelectric substrate 305, IDT electrodes 315, and a plurality of terminals 318. The piezoelectric substrate 305 has a first principal surface 311 and a second principal surface 312 that face each other. In addition, the piezoelectric substrate 305 also has an outer peripheral surface 313 that connects the first principal surface 311 and the second principal surface 312 together. The IDT electrodes 315 are provided on the first principal surface 311 of the piezoelectric substrate 305. The piezoelectric substrate 305 may be a substrate of a piezoelectric material, which may be lithium tantalate or lithium niobate, for example. However, the piezoelectric substrate 305 does not have to be a substrate of a piezoelectric material but may also be a stacked substrate just like the piezoelectric substrate 200. The second acoustic wave filter 3 includes a plurality of IDT electrodes 315. Note that only two out of the plurality of IDT electrodes 315 are shown schematically in FIG. 3. In this RF module 1, each of the transmission filter 12A and reception filter 22A of the first filter 32A serving as the second acoustic wave filter 3 may be implemented as a ladder filter. In addition, in this RF module 1, each of the transmission filter 12C and reception filter 22C of the second filter 32C serving as the second acoustic wave filter 3 may also be implemented as a ladder filter.

In addition, the second acoustic wave filter 3 includes, as constituent elements of a package structure, a spacer layer 314, a cover member 316, and a plurality of terminals 318. The spacer layer 314 and the cover member 316 are provided over the first principal surface 311 of the piezoelectric substrate 305. When viewed in plan along the thickness of the second acoustic wave filter 3, the spacer layer 314 surrounds the plurality of IDT electrodes 315. Also, when viewed in plan along the thickness of the second acoustic wave filter 3, the spacer layer 314 has a frame shape (such as a rectangular frame shape). The spacer layer 314 has electrical insulation properties. The spacer layer 314 may be made of an epoxy resin, polyimide, or any other suitable material. The cover member 316 may have a flat plate shape. When viewed in plan along the thickness of the second acoustic wave filter 3, the cover member 316 may have a rectangular shape. However, this is only an example of the present disclosure and should not be construed as limiting. Alternatively, the cover member 316 may also have a square shape, for example. In this second acoustic wave filter 3, when viewed in plan along the thickness of the second acoustic wave filter 3, the cover member 316, the spacer layer 314, and the piezoelectric substrate 305 all have generally the same outer dimensions. The cover member 316 is arranged on the spacer layer 314 to face the piezoelectric substrate 305 along the thickness of the second acoustic wave filter 3. When viewed in plan along the thickness of the second acoustic wave filter 3, the cover member 316 overlaps with the plurality of IDT electrodes 315. In addition, the cover member 316 is spaced from the plurality of IDT electrodes 315 along the thickness of the second acoustic wave filter 3. The cover member 316 has electrical insulation properties. The cover member 316 may be made of an epoxy resin, polyimide, or any other suitable material. The second acoustic wave filter 3 has a space S2 surrounded with the piezoelectric substrate 305, the spacer layer 314, and the cover member 316. In the second acoustic wave filter 3, the space S2 is filled with a gas. The gas may be the air or an inert gas (such as a nitrogen gas), for example. The plurality of terminals 318 of the second acoustic wave filter 3 are exposed out of the cover member 316. Each of the plurality of terminals 318 may be implemented as a bump, for example. The bumps may be solder bumps, for example. However, this is only an example of the present disclosure and should not be construed as limiting. Alternatively, the bumps may also be gold bumps, for example.

The first acoustic wave filter 2 is a bare chip with no package structure and has a smaller thickness than the second acoustic wave filter 3.

When measured along the thickness D1 of the mount board 9, the dimension of the second acoustic wave filter 3 may be smaller than the dimension of a surface-mount inductor included in the output matching circuit 13, for example. In addition, when measured along the thickness D1 of the mount board 9, the dimension of the second acoustic wave filter 3 may be smaller than the dimension of a surface-mount inductor included in each of the three matching circuits 14A-14C, for example.

The RF module 1 further includes a resin layer 101 (hereinafter referred to as a "first resin layer 101"). The first resin layer 101 is provided on the first principal surface 91 of the mount board 9 to cover the plurality of circuit components arranged on the first principal surface 91 of the mount board 9. In this embodiment, the first resin layer 101 encapsulates the plurality of circuit components arranged on the first principal surface 91 of the mount board 9. The plurality of circuit components arranged on the first principal surface 91 of the mount board 9 includes the power amplifier 11, the filters 32A, 32C, the output matching circuit 13, the three matching circuits 14A-14C, and the low-pass filter 16. The first resin layer 101 contains a resin. Optionally, the first resin layer 101 may contain not only the resin but also a filler as well.

The RF module 1 further includes a resin film 19. The resin film 19 is provided on the second principal surface 92 of the mount board 9. In the RF module 1 according to the first embodiment, the resin film 19 covers the second principal surface 212 and outer peripheral surface 213 of the piezoelectric substrate 200 as shown in FIG. 3. The resin film 19 includes a first part 191 covering the second principal surface 212 of the piezoelectric substrate 200 and a second part 192 covering the outer peripheral surface 213 of the piezoelectric substrate 200 and provided in contact with the second principal surface 92 of the mount board 9. The space S1 between the acoustic wave filter 2 and the second principal surface 92 of the mount board 9 is surrounded with the acoustic wave filter 2, the second principal surface 92 of the mount board 9, and the resin film 19. The entire outer peripheral portion of the resin film 19 is in contact with the second principal surface 92 of the mount board 9. A material for the resin film 19 includes an epoxy resin, for example. The space S1 is filled with a gas. The gas may be the air or an inert gas (such as a nitrogen gas), for example.

The RF module 1 according to the first embodiment further includes another resin layer 102 (hereinafter referred to as a "second resin layer 102"). The second resin layer 102 is provided on the second principal surface 92 of the mount board 9. The second resin layer 102 covers the resin film 19. In addition, in this RF module 1, the second resin layer 102 also covers, on the second principal surface 92 of the mount board 9, respective parts of plurality of circuit components and the plurality of external connection terminals 8 mounted on the second principal surface 92 of the mount board 9. In this embodiment, the plurality of circuit components includes the first switch 5, the second switch 4, the fourth switch 7, the controller 15, the IC chip 10, and the filter 32B. The second resin layer 102 is also provided to expose respective tip surfaces of the plurality of external connection terminals 8. In addition, the second resin layer 102 also covers the filter 32B via the resin film 19. The second resin layer 102 contains a resin. Optionally, the second resin layer 102 may contain not only the resin but also a filler as well. The material for the second resin layer 102 may be the same as, or different from, the material for the first resin layer 101.

In addition, the RF module 1 further includes a shield layer 103. The shield layer 103 may be made of a metallic material, for example. The shield layer 103 covers the principal surface 1011 and outer peripheral surface 1013 of the first resin layer 101, the outer peripheral surface 93 of the mount board 9, and the outer peripheral surface 1023 of the second resin layer 102. The shield layer 103 is in contact with the ground layer of the mount board 9. Thus, in the RF module 1, the shield layer 103 may have the same potential as the ground layer.

(3) Effect
(3.1) RF Module
The RF module 1 according to the first embodiment includes: the mount board 9 having the first principal surface 91 and the second principal surface 92 that face each other; the electronic components (including the power amplifier 11, the filters 32A, 32C, the output matching circuit 13, the matching circuits 14A-14C, and the low-pass filter 16) arranged on the first principal surface 91 of the mount board 9; the external connection terminals 8; and the acoustic wave filter 2. The external connection terminals 8 are arranged on the second principal surface 92 of the mount board 9. The acoustic wave filter 2 is arranged on the second principal surface 92 of the mount board 9. The acoustic wave filter 2 is implemented as a bare chip. Note that the number of the electronic components arranged on the first principal surface 91 of the mount board 9 may be either single or plural.

In the RF module 1 according to the first embodiment, the acoustic wave filter 2 arranged on the second principal surface 92 of the mount board 9 is implemented as a bare chip. This allows the RF module 1 to have its height on the second principal surface 92 of the mount board 9 reduced along the thickness D1 of the mount board 9, thus contributing to reducing the overall height of the RF module 1.

Also, in the RF module 1 according to the first embodiment, the acoustic wave filter 2 includes the piezoelectric substrate 200, the IDT electrodes 215, and the plurality of pad electrodes 216. The piezoelectric substrate 200 has the first principal surface 211 and the second principal surface 212 that face each other. The IDT electrodes 215 are provided on the first principal surface 211 of the piezoelectric substrate 200. The plurality of pad electrodes 216 are provided over the first principal surface 211 of the piezoelectric substrate 200. The RF module 1 further includes the plurality of bumps 17. The plurality of bumps 17 are bonded to the plurality of pad electrodes 216 and the mount board 9. The IDT electrodes 215 are arranged in the space S1 formed between the piezoelectric substrate 200 and the mount board 9 by the plurality of pad electrodes 216, the plurality of bumps 17, the piezoelectric substrate 200, and the mount board 9. This allows the RF module 1 according to the first embodiment to have its height reduced along the thickness D1 of the mount board 9.

Furthermore, in the RF module 1 according to the first embodiment, the space S1 is surrounded with the acoustic wave filter 2, the second principal surface 92 of the mount board 9, and the resin film 19. Thus, the RF module 1 according to the first embodiment reduces the chances of foreign particles entering the space S1, thus significantly reducing the deterioration of its characteristic.

Furthermore, in the RF module 1 according to the first embodiment, the resin layer 102 arranged on the second principal surface 92 of the mount board 9 covers the resin film 19. This allows the RF module 1 according to the first embodiment to have improved reliability.

Furthermore, in the RF module 1 according to the first embodiment, the acoustic wave filter 2 (filter 32B) includes the reception filter 22B and the IC chip 10 including the low-noise amplifier 21 is arranged on the second principal surface 92 of the mount board 9. This allows the RF module 1 according to the first embodiment to shorten the length of a wire between the reception filter 22B and the low-noise amplifier 21.

(3.2) Communications Device
A communications device 300 according to the first embodiment includes the RF module 1 and the signal processor circuit 301. The signal processor circuit 301 performs signal processing on an RF signal passing through the acoustic wave filter 2 of the RF module 1.

The communications device 300 according to the first embodiment includes the RF module 1, and therefore, contributes to providing a communications device 300, of which the height is reduced along the thickness of the mount board 9. The plurality of electronic components that form the signal processor circuit 301 may be mounted on the circuit board described above. Alternatively, those electronic components that form the signal processor circuit 301 may be mounted on another circuit board (second circuit board) provided separately from the circuit board (first circuit board) on which the RF module 1 is mounted.

(4) Variations of RF Module (4.1) First Variation

Figure 4:
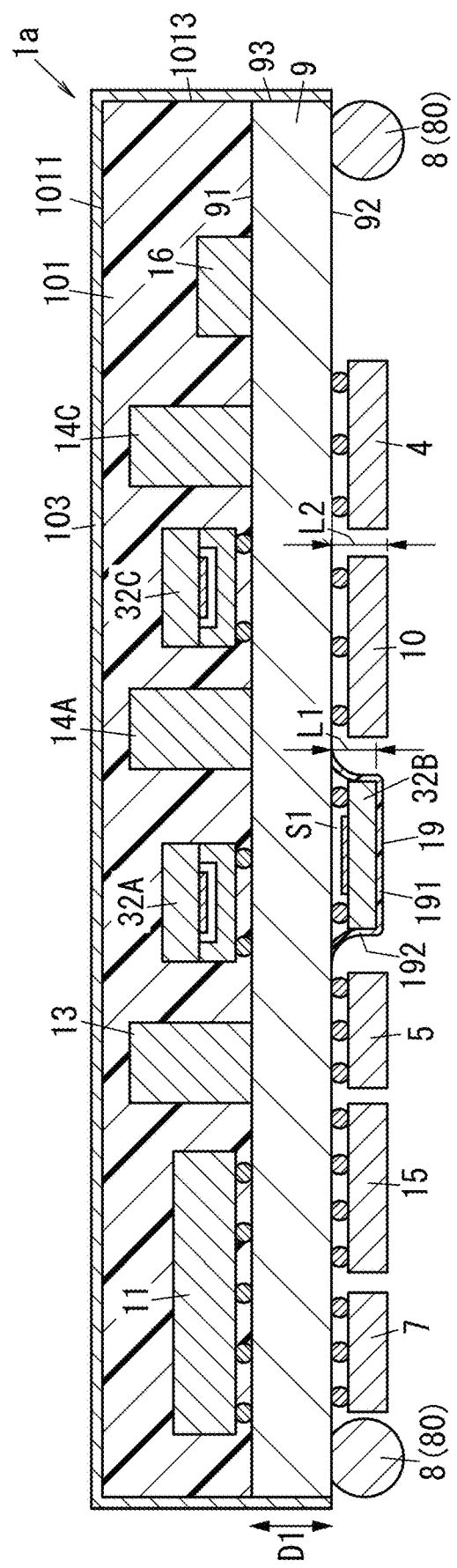
FIG. 4 is a cross-sectional view of an RF module according to a first variation of the first embodiment.

An RF module 1a according to a first variation of the first embodiment will be described with reference to FIG. 4. In the following description, any constituent element of the RF module 1a according to this first variation, having the same function as a counterpart of the RF module 1 according to the first embodiment described above, will be designated by the same reference numeral as that counterpart's, and description thereof will be omitted herein.

In the RF module 1a according to the first variation, the plurality of external connection terminals 8 are implemented as ball bumps, which is a difference from the RF module 1 according to the first embodiment. In addition, the RF module 1a according to this variation does not include the second resin layer 102 of the RF module 1 according to the first embodiment, which is another difference from the RF module 1 according to the first embodiment. Optionally, the RF module 1a according to the first variation may include an underfilling portion provided in the gap between each of the first switch 5, the second switch 4, the fourth switch 7, the IC chip 10, and the controller 15 and the second principal surface 92 of the mount board 9.

The ball bumps serving as the respective external connection terminals 8 may be made of gold, copper, solder, or any other suitable material.

Optionally, the plurality of external connection terminals 8 may include both external connection terminals 8 implemented as ball bumps and external connection terminals 8 implemented as columnar electrodes.

In the RF module 1a according to this first variation, a first distance L1 is shorter than a second distance L2. The first distance L1 is the distance between the second principal surface 92 of the mount board 9 and a surface, facing away from the mount board 9, of the filter 32B. The second distance L2 is the distance between the second principal surface 92 of the mount board 9 and a surface, facing away from the mount board 9, of the IC chip 10.

This configuration allows the RF module 1a according to the first variation to have its height reduced along the thickness D1 of the mount board 9.

(4.2) Second Variation

Figure 5:
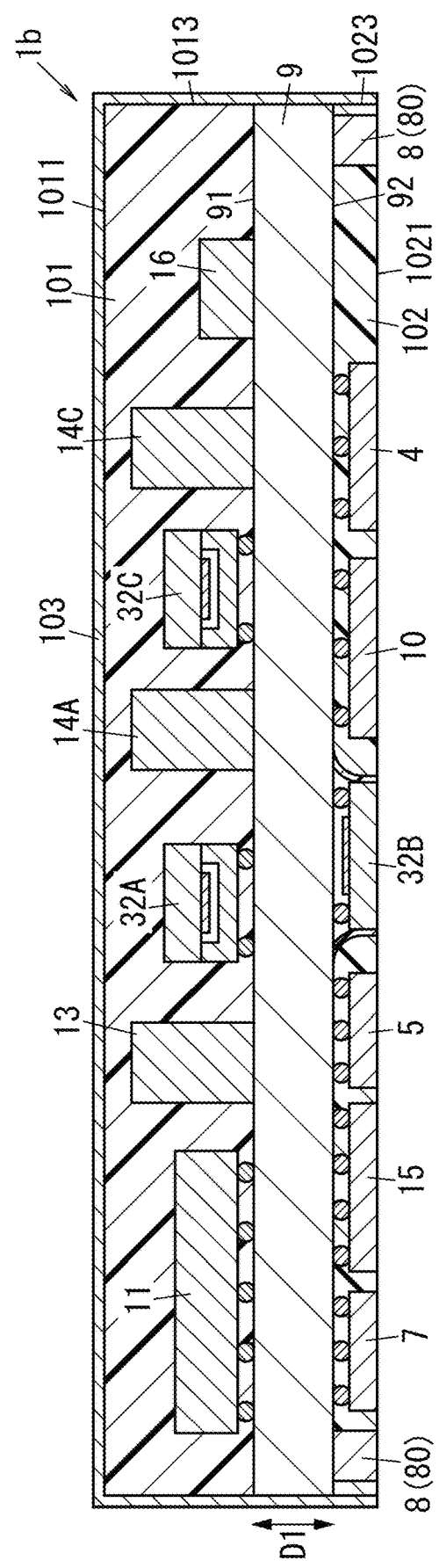
FIG. 5 is a cross-sectional view of an RF module according to a second variation of the first embodiment.

An RF module 1b according to a second variation of the first embodiment will be described with reference to FIG. 5. In the following description, any constituent element of the RF module 1b according to this second variation, having the same function as a counterpart of the RF module 1 according to the first embodiment described above, will be designated by the same reference numeral as that counterpart's, and description thereof will be omitted herein.

In the RF module 1b according to this second variation, each of the circuit components arranged on the second principal surface 92 of the mount board 9 has their surface, facing away from the mount board 9, exposed, which is a major difference from the RF module 1 according to the first embodiment. In this variation, the plurality of circuit components arranged on the second principal surface 92 of the mount board 9 includes the first switch 5, the second switch 4, the fourth switch 7, the IC chip 10, the controller 15, and the filter 32B. Specifically, in the RF module 1b according to this second variation, the respective surfaces, facing away from the mount board 9, of the plurality of circuit components, the principal surface 1021 of the second resin layer 102, and the respective tip surfaces of the plurality of external connection terminals 8 are generally flush with each other. The surface, facing away from the mount board 9, of the filter 32B is the second principal surface 212 of the piezoelectric substrate 200 as shown in FIG. 3. In the RF module 1b according to the second variation, the resin film 19 covers the entire outer peripheral surface 213 of the piezoelectric substrate 200.

This configuration allows the RF module 1b according to the second variation to have a further reduced height, compared to the RF module 1 according to the first embodiment.

(4.3) Third Variation

Figure 6:
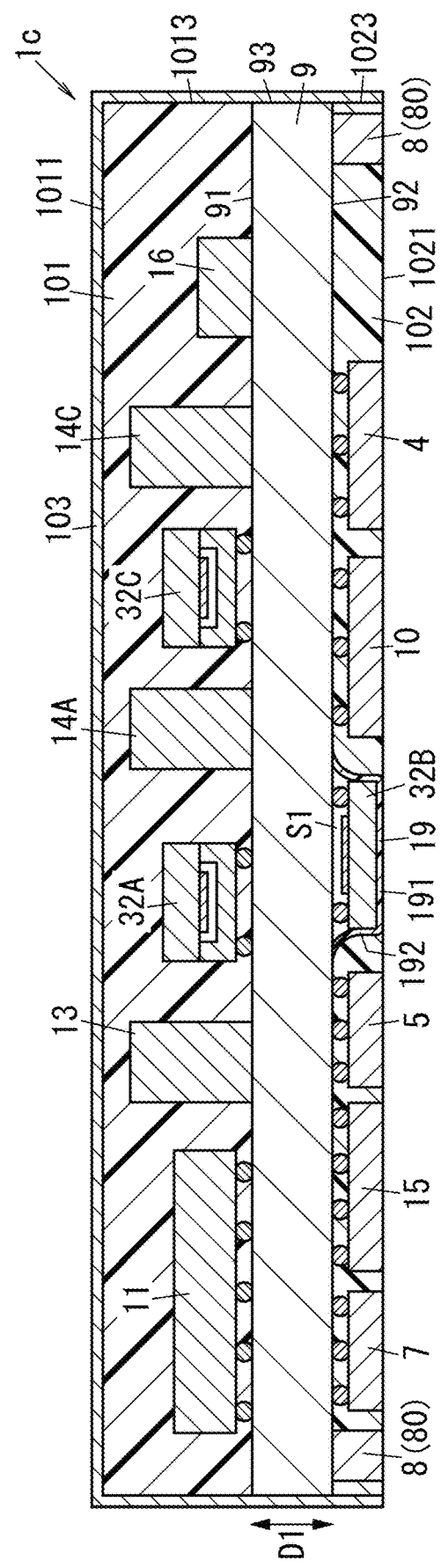
FIG. 6 is a cross-sectional view of an RF module according to a third variation of the first embodiment.

An RF module 1c according to a third variation of the first embodiment will be described with reference to FIG. 6. In the following description, any constituent element of the RF module 1c according to this third variation, having the same function as a counterpart of the RF module 1b according to the second variation described above, will be designated by the same reference numeral as that counterpart's, and description thereof will be omitted herein.

In the RF module 1c according to this third variation, the resin film 19 covers not only the outer peripheral surface 213 of the piezoelectric substrate 200 but also the second principal surface 212 thereof as well, which is a major difference from the RF module 1b according to the second variation described above.

In the RF module 1c according to the third variation, the resin film 19 is peelable less easily than the RF module 1b according to the second variation of the first embodiment described above. In addition, the RF module 1c according to the third variation reduces the chances of foreign particles entering the space S1 compared to the RF module 1b according to the second variation. This allows the RF module 1c according to the third variation to have improved reliability, compared to the RF module 1b according to the second variation.

Second Embodiment

Figure 7:
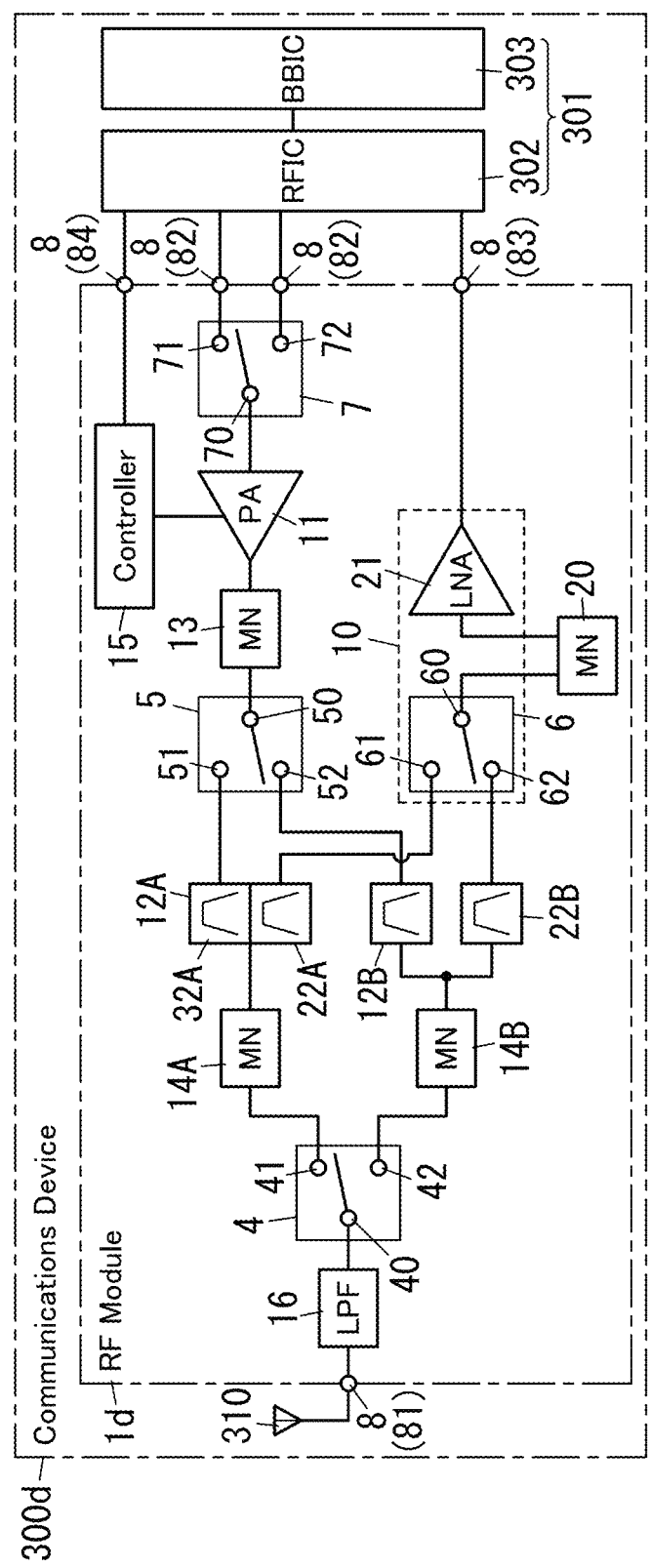
FIG. 7 is a circuit diagram of an RF module according to a second embodiment and a communications device including the RF module.

An RF module 1d and communications device 300d according to a second embodiment will be described with reference to FIGS. 7 and 8. In the following description, any constituent element of the RF module 1d and communications device 300d according to this second embodiment, having the same function as a counterpart of the RF module 1 and communications device 300 according to the first embodiment described above, will be designated by the same reference numeral as that counterpart's, and description thereof will be omitted herein.

The RF module 1d according to the second embodiment includes, instead of the filter 32B implemented as a duplexer including the transmission filter 12B and the reception filter 22B in the RF module 1 according to the first embodiment, the transmission filter 12B and the reception filter 22B provided as two separate circuit components, which is a difference from the RF module 1 according to the first embodiment. In addition, the RF module 1d according to the second embodiment does not include the filter 32C of the RF module 1 according to the first embodiment, which is another difference from the RF module 1 according to the first embodiment.

Figure 8:
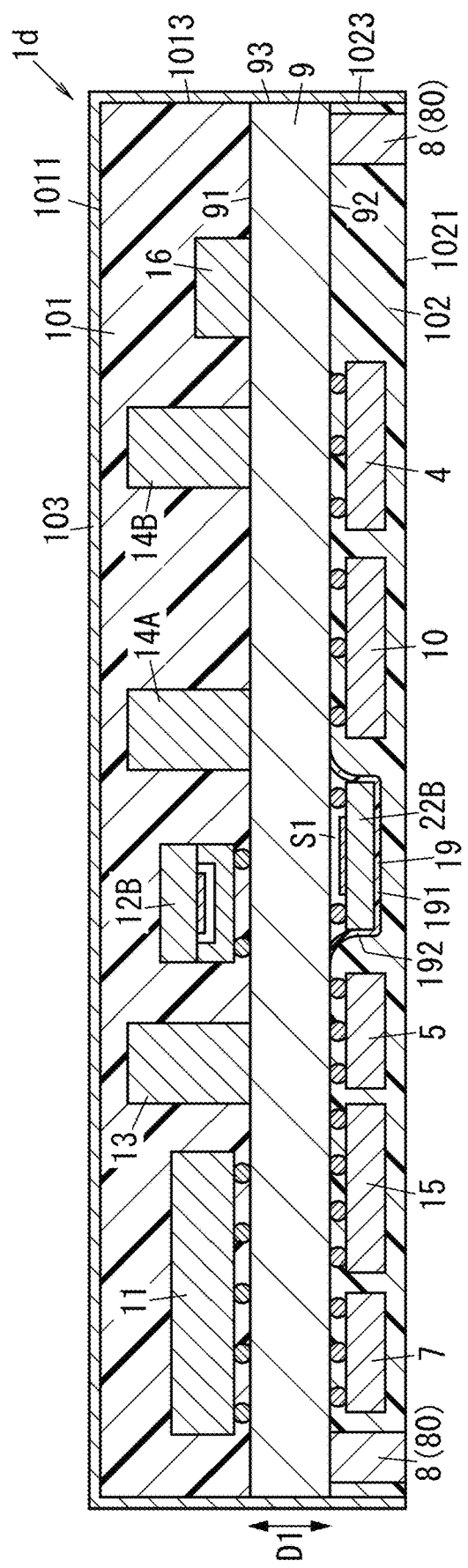
FIG. 8 is a cross-sectional view of the RF module.

In the RF module 1d according to the second embodiment, the transmission filter 12B is arranged on the first principal surface 91 of the mount board 9 and the reception filter 22B is arranged on the second principal surface 92 of the mount board 9 as shown in FIG. 8. This configuration allows the RF module 1*d* according to the second embodiment to increase the degree of isolation between the transmission filter 12B and the reception filter 22B.

In the RF module 1*d* according to the second embodiment, the transmission filter 12B, as well as the acoustic wave filter 3 (see FIG. 3), is an acoustic wave filter having a package structure, and the reception filter 22B, as well as the acoustic wave filter 2 (see FIG. 3), is a bare-chip acoustic wave filter.

In the RF module 1*d* according to the second embodiment, as well as in the RF module 1 according to the first embodiment, the acoustic wave filter (reception filter 22B) arranged on the second principal surface 92 of the mount board 9 is a bare chip, thus contributing to having the height of the RF module 1*d* on the second principal surface 92 of the mount board 9 reduced along the thickness D1 of the mount board 9 and thereby reducing the overall height of the RF module 1*d*.

Third Embodiment

Figure 9:
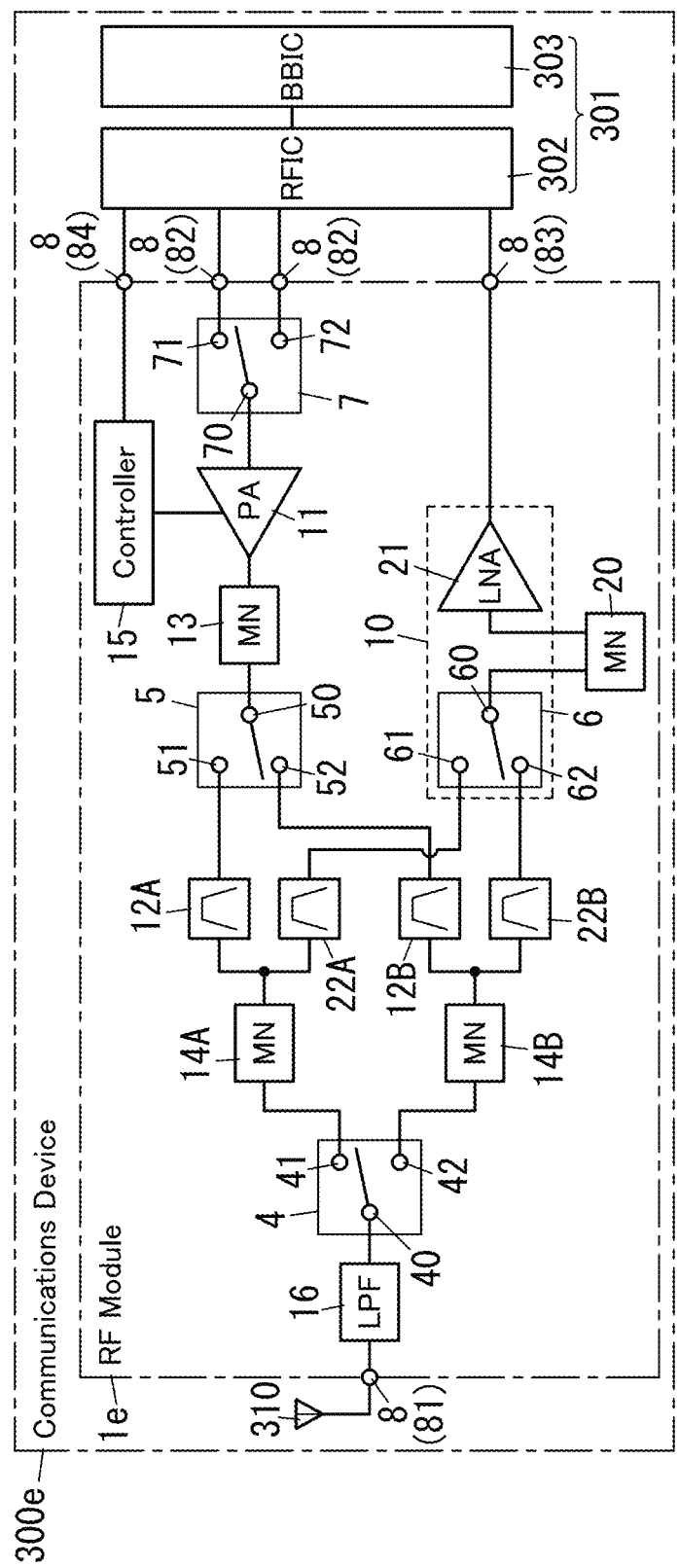
FIG. 9 is a circuit diagram of an RF module according to a third embodiment and a communications device including the RF module.

An RF module 1*e* and communications device 300*e* according to a third embodiment will be described with reference to FIGS. 9-11. In the following description, any constituent element of the RF module 1*e* and communications device 300*e* according to this third embodiment, having the same function as a counterpart of the RF module 1*d* and communications device 300*d* according to the second embodiment described above, will be designated by the same reference numeral as that counterpart's, and description thereof will be omitted herein.

The RF module 1*e* according to the third embodiment includes, instead of the filter 32A implemented as a duplexer including the transmission filter 12A and the reception filter 22A in the RF module 1*d* according to the second embodiment, the transmission filter 12A and the reception filter 22A provided as two separate circuit components, which is a difference from the RF module 1*d* according to the second embodiment.

Figure 10:
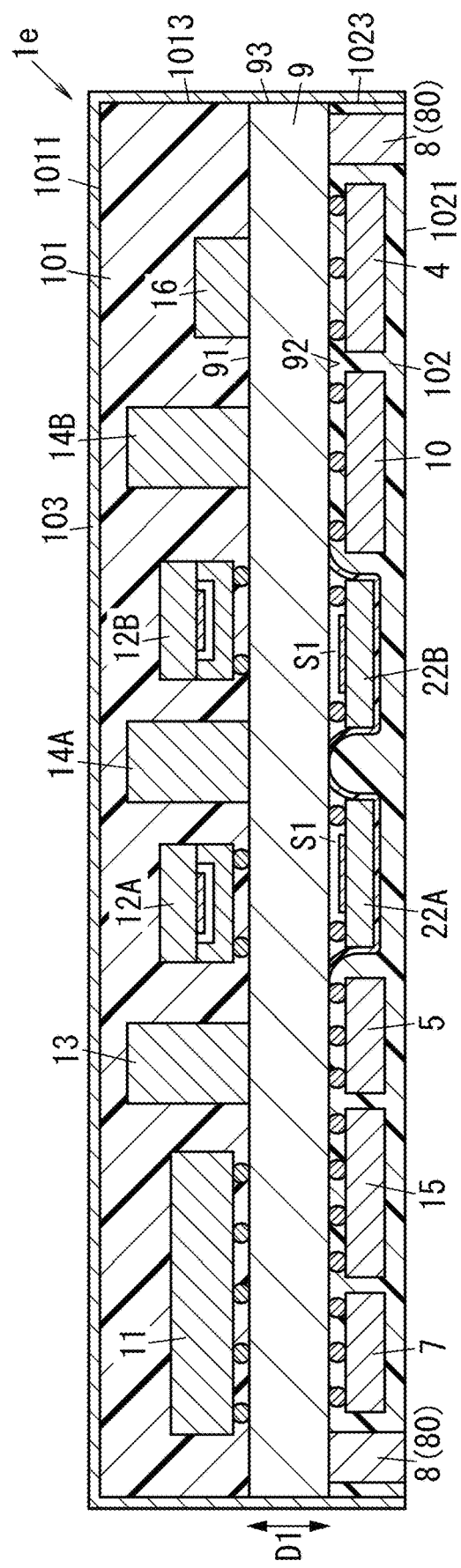
FIG. 10 is a cross-sectional view of the RF module.
Figure 11:
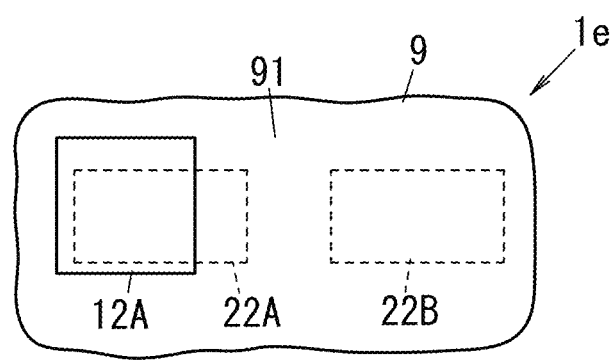
FIG. 11 is a plan view of a part of the RF module.

In the RF module 1*e* according to the third embodiment, the two transmissions filters 12A and 12B are arranged on the first principal surface 91 of the mount board 9 and the two reception filters 22A and 22B are arranged on the second principal surface 92 of the mount board 9 as shown in FIG. 10. This configuration allows the RF module 1*e* according to the third embodiment to increase the degree of isolation between each of the transmission filters 12A and 12B and a corresponding one of the reception filters 22A and 22B. In addition, in the RF module 1*e* according to the third embodiment, when viewed in plan along the thickness D1 of the mount board 9, the transmission filter 12A and the reception filter 22B do not overlap with each other. This configuration allows the RF module 1*e* according to the third embodiment to increase the degree of isolation between the transmission filter 12A and the reception filter 22B.

In the RF module 1*e* according to the third embodiment, each of the transmission filters 12A and 12B, as well as the acoustic wave filter 3 (see FIG. 3), is an acoustic wave filter having a package structure, and each of the reception filters 22A and 22B, as well as the acoustic wave filter 2 (see FIG. 3), is a bare-chip acoustic wave filter. This allows the RF module 1*e* according to the third embodiment to have its height on the second principal surface 92 of the mount board 9 reduced along the thickness D1 of the mount board 9, thereby contributing to reducing the overall height of the RF module 1*e*.

Fourth Embodiment

Figure 12:
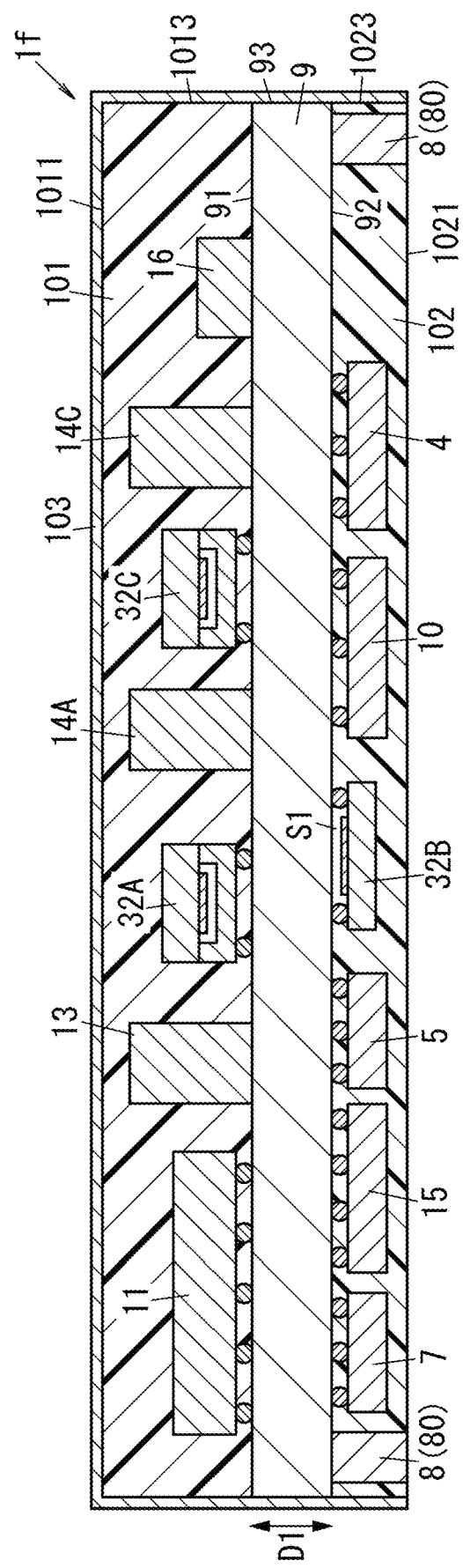
FIG. 12 is a cross-sectional view of an RF module according to a fourth embodiment.

An RF module 1*f* according to a fourth embodiment will be described with reference to FIGS. 12 and 13. In the following description, any constituent element of the RF module 1*f* according to this fourth embodiment, having the same function as a counterpart of the RF module 1 according to the first embodiment described above, will be designated by the same reference numeral as that counterpart's, and description thereof will be omitted herein. Note that the RF module 1*f* according to this fourth embodiment may replace the RF module 1 of the communications device 300 according to the first embodiment, for example.

The RF module 1*f* according to the fourth embodiment does not include the resin film 19 of the RF module 1 according to the first embodiment, which is a major difference from the RF module 1 according to the first embodiment. In the RF module 1*f* according to the fourth embodiment, the resin layer 102 covers the outer peripheral surface 213 of the piezoelectric substrate 200 shown in FIG. 3. In the RF module 1*f* according to the fourth embodiment, the space S1 is surrounded with the acoustic wave filter 2, the second principal surface 92 of the mount board 9, and the resin layer 102.

In the RF module 1*f* according to the fourth embodiment, as well as in the RF module 1 according to the first embodiment, the acoustic wave filter 2 (see FIG. 3) arranged on the second principal surface 92 of the mount board 9 is a bare chip, thus allowing the RF module 1*f* to have its height on the second principal surface 92 of the mount board 9 reduced along the thickness D1 of the mount board 9 and thereby contributing to reducing the overall height of the RF module 1*f*.

In the RF module 1*f* according to the fourth embodiment, the resin layer 102 covers the outer peripheral surface 213 of the piezoelectric substrate 200, thus reducing the chances of foreign particles entering the space S1 and thereby reducing the deterioration of its characteristic as well. In addition, in the RF module 1*f* according to the fourth embodiment, the resin layer 102 covers the second principal surface 212 of the piezoelectric substrate 200. This allows the RF module 1*f* according to the fourth embodiment to have improved reliability as well.

Figure 13:
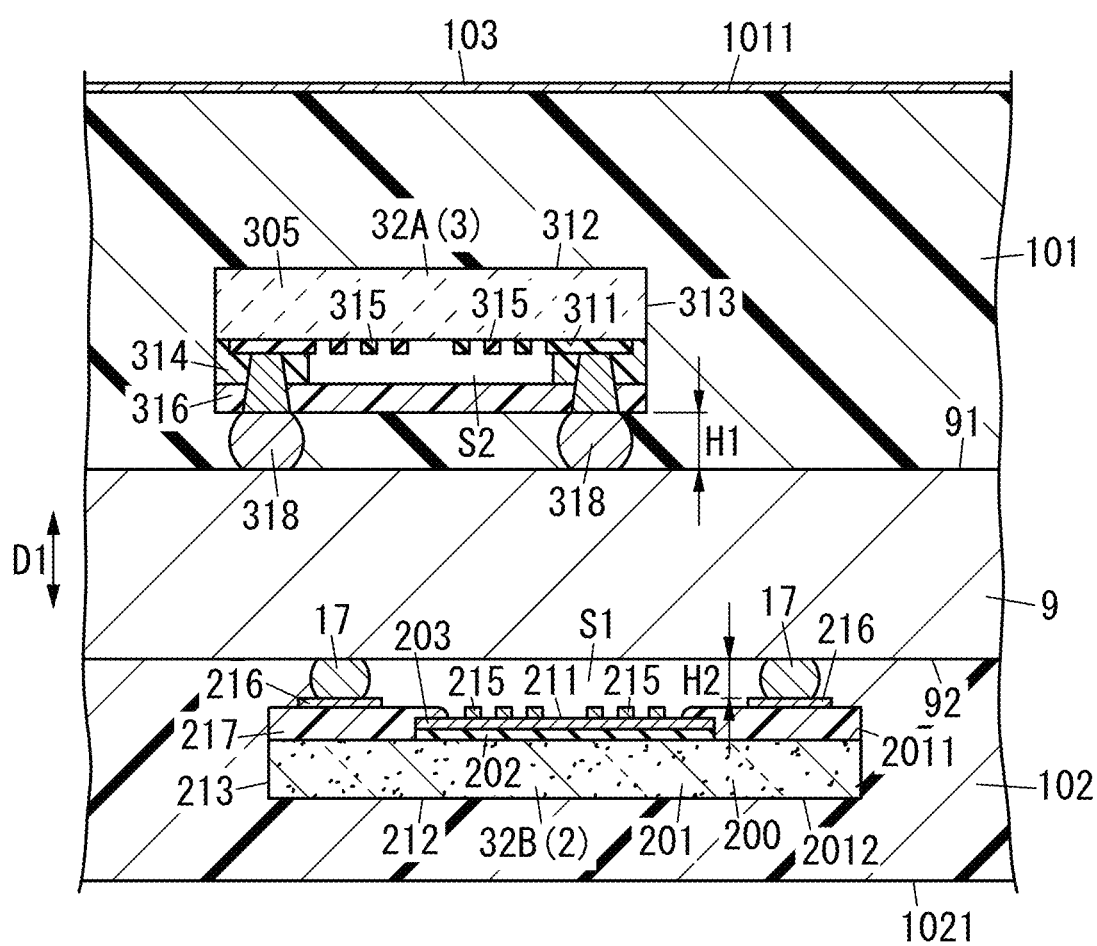
FIG. 13 is a cross-sectional view of a part of the RF module.

In the RF module 1*f* according to the fourth embodiment, when measured along the thickness D1 of the mount board 9, the dimension H2 of the bumps 17 is smaller than the dimension H1 of the terminals 318 of the acoustic wave filter 3 as shown in FIG. 13. This allows the RF module 1*f* according to the fourth embodiment to reduce, when the second resin layer 102 is formed over the second principal surface 92 of the mount board 9 during its manufacturing process, the chances of the resin as a material for the second resin layer 102 entering the space S1.

(Other Variations)

Note that the first to fourth embodiments described above are only exemplary ones of various embodiments of the present disclosure and should not be construed as limiting. Rather, the exemplary embodiments described above may be readily modified in various manners depending on a design choice or any other factor without departing from the scope of the present disclosure.

For example, the mount board 9 may be a board in which various circuit components are built.

Also, the power amplifier 11 does not have to be flip-chip bonded onto the first principal surface 91 of the mount board 9 but may also be bonded thereto with bonding wires, for example. That is to say, the power amplifier 11 may be arranged on (i.e., mechanically connected to) the first principal surface 91 of the mount board 9 so as to be bonded with a die-bonding material onto the first principal surface 91 of the mount board 9 and may have its terminals (pad electrodes) electrically connected to a conductor portion of the conductor pattern on the first principal surface 91 of the mount board 9 with bonding wires. Likewise, the acoustic wave filter 2 does not have to be flip-chip bonded onto the second principal surface 92 of the mount board 9 but may also be bonded thereto with bonding wires, for example.

Also, the RF module 1 may include only the signal paths for the transmission signals, not both the signal paths for the transmission signals and the signal paths for the reception signals. In that case, the plurality of filters 32A-32C of the RF module 1 may be implemented as a plurality of transmission filters 12A-12C, instead of the duplexers.

Furthermore, in the embodiments described above, the plurality of filters 32A-32C are implemented as acoustic wave filters that use a surface acoustic wave. However, this is only an example of the present disclosure and should not be construed as limiting. Alternatively, the plurality of filters 32A-32C may also be implemented as acoustic wave filters that use a boundary acoustic wave, a lamb wave, or any other suitable acoustic wave.

In the RF module 1, the two filters 32A and 32C arranged on the first principal surface 91 of the mount board 9 do not have to be acoustic wave filters that use a surface acoustic wave but may be bulk acoustic wave (BAW) filters as well.

(Aspects)

The embodiments and their variations described above are specific implementations of the following aspects of the present disclosure.

A radio-frequency module (1; 1a; 1b; 1c; 1d; 1e; 1f) according to a first aspect includes a mount board (9), an electronic component, an external connection terminal (8), and an acoustic wave filter (2). The mount board (9) has a first principal surface (91) and a second principal surface (92) that face each other. The electronic component is arranged on the first principal surface (91) of the mount board (9). The external connection terminal (8) is arranged on the second principal surface (92) of the mount board (9). The acoustic wave filter (2) is arranged on the second principal surface (92) of the mount board (9). The acoustic wave filter (2) is a bare-chip acoustic wave filter.

The radio-frequency module (1; 1a; 1b; 1c; 1d; 1e; 1f) according to the first aspect may have its height reduced along the thickness (D1) of the mount board (9).

In a radio-frequency module (1; 1a; 1b; 1c; 1d; 1e; 1f) according to a second aspect, which may be implemented in conjunction with the first aspect, the bare-chip acoustic wave filter (2) includes a piezoelectric substrate (200), an IDT electrode (215), and a plurality of pad electrodes (216). The piezoelectric substrate (200) has a first principal surface (211) and a second principal surface (212) that face each other. The IDT electrode (215) is provided on the first principal surface (211) of the piezoelectric substrate (200). The plurality of pad electrodes (216) are provided over the first principal surface (211) of the piezoelectric substrate (200). The radio-frequency module (1; 1a; 1b; 1c; 1d; 1e; 1f) further includes a plurality of bumps (17). The plurality of bumps (17) are bonded to the plurality of pad electrodes (216) and the mount board (9). The IDT electrode (215) is arranged in a space (S1) formed between the piezoelectric substrate (200) and the mount board (9) by the plurality of pad electrodes (216), the plurality of bumps (17), the piezoelectric substrate (200), and the mount board (9).

The radio-frequency module (1; 1a; 1b; 1c; 1d; 1e; 1f) according to the second aspect may have its height reduced along the thickness (D1) of the mount board (9).

A radio-frequency module (1; 1a; 1b; 1c; 1d; 1e) according to a third aspect, which may be implemented in conjunction with the second aspect, further includes a resin film (19). The resin film (19) is arranged on the second principal surface (92) of the mount board (9). The resin film (19) covers at least an outer peripheral surface (213) of the piezoelectric substrate (200). The space (S1) is surrounded with the bare-chip acoustic wave filter (2), the second principal surface (92) of the mount board (9), and the resin film (19).

The radio-frequency module (1; 1a; 1b; 1c; 1d; 1e) according to the third aspect reduces the chances of foreign particles entering the space (S1), thus significantly reducing the deterioration of its characteristic.

In a radio-frequency module (1; 1a; 1b; 1d; 1e) according to a fourth aspect, which may be implemented in conjunction with the third aspect, the resin film (19) covers the second principal surface (212) of the piezoelectric substrate (200).

The radio-frequency module (1; 1a; 1b; 1d; 1e) according to the fourth aspect may have improved reliability.

A radio-frequency module (1; 1a; 1b; 1c; 1d; 1e) according to a fifth aspect, which may be implemented in conjunction with the third or fourth aspect, further includes a resin layer (102). The resin layer (102) is arranged on the second principal surface (92) of the mount board (9). The resin layer (102) covers the resin film (19) at least partially.

The radio-frequency module (1; 1a; 1b; 1c; d; 1e) according to the fifth aspect may have further improved reliability.

A radio-frequency module (1f) according to a sixth aspect, which may be implemented in conjunction with the second aspect, further includes a resin layer (102). The resin layer (102) is arranged on the second principal surface (92) of the mount board (9). The resin layer (102) covers an outer peripheral surface (213) of the piezoelectric substrate (200). The space (S1) is surrounded with the bare-chip acoustic wave filter (2), the second principal surface (92) of the mount board (9), and the resin layer (102).

The radio-frequency module (1f) according to the sixth aspect reduces the chances of foreign particles entering the space (S1), thus significantly reducing the deterioration of its characteristic.

In a radio-frequency module (1; 1a; 1b; 1c; 1d; 1e; 1f) according to a seventh aspect, which may be implemented in conjunction with any one of the first to sixth aspects, the bare-chip acoustic wave filter (2) includes a reception filter (22B; 22A, 22B). The radio-frequency module (1; 1a; 1b; 1c; 1d; 1e; 1f) further includes an IC chip (10). The IC chip (10) is arranged on the second principal surface (92) of the mount board (9). The IC chip (10) includes a low-noise amplifier (21). The low-noise amplifier (21) amplifies a radio-frequency signal that has passed through the reception filter (22B; 22A, 22B).

The radio-frequency module (1; 1a; 1b; 1c; 1d; 1e; 1f) according to the seventh aspect allows the wire between the reception filter (22B; 22A, 22B) and the low-noise amplifier (21) to have a shorter length.

In a radio-frequency module (1; 1a; 1b; 1d; 1e; 1f) according to an eighth aspect, which may be implemented in conjunction with the seventh aspect, a first distance (L1) is shorter than a second distance (L2). The first distance (L1)

is a distance between the second principal surface (92) of the mount board (9) and a surface, facing away from the mount board (9), of the bare-chip acoustic wave filter (2). The second distance (L2) is a distance between the second principal surface (92) of the mount board (9) and a surface, facing away from the mount board (9), of the IC chip (10).

The radio-frequency module (1; 1a; 1b; 1d; 1e; 1f) according to the eighth aspect may have its height reduced along the thickness (D1) of the mount board (9).

A communications device (300; 300d; 300e) according to a ninth aspect includes the radio-frequency module (1; 1a; 1b; 1c; 1d; 1e; 1f) according to any one of the first to eighth aspects and a signal processor circuit (301). The signal processor circuit (301) performs signal processing on a radio-frequency signal passing through the bare-chip acoustic wave filter (2) of the radio-frequency module (1; 1a; 1b; 1c; 1d; 1e; 1f).

The communications device (300; 300d; 300e) according to the ninth aspect may have its height reduced along the thickness (D1) of the mount board (9).

The invention claimed is:

1. A radio-frequency module comprising:
a mount board having a first principal surface on one side of the mount board and a second principal surface on an opposite side of the mount board;
an electronic component arranged on the first principal surface of the mount board;
an external connection terminal arranged on the second principal surface of the mount board; and
a bare-chip acoustic wave filter arranged on the second principal surface of the mount board,
wherein
the bare-chip acoustic wave filter includes:
a piezoelectric substrate having a first principal substrate surface and a second principal substrate surface on opposite sides of the piezoelectric substrate;
an interdigital transducer (IDT) electrode provided on the first principal substrate surface of the piezoelectric substrate; and
a plurality of pad electrodes provided over the first principal substrate surface of the piezoelectric substrate, wherein
the radio-frequency module further includes a plurality of bumps bonded to the plurality of pad electrodes and the mount board, and
the IDT electrode is arranged in a space between the piezoelectric substrate and the mount board by the plurality of pad electrodes, the plurality of bumps, the piezoelectric substrate, and the mount board.

2. The radio-frequency module of claim 1, further comprising a resin film arranged on the second principal surface of the mount board and covering at least an outer peripheral surface of the piezoelectric substrate, wherein
the space is surrounded with the bare-chip acoustic wave filter, the second principal surface of the mount board, and the resin film.

3. The radio-frequency module of claim 2, wherein
the resin film covers the second principal substrate surface of the piezoelectric substrate.

4. The radio-frequency module of claim 3, further comprising a resin layer arranged on the second principal surface of the mount board and at least partially covering the resin film.

5. The radio-frequency module of claim 4, wherein
the bare-chip acoustic wave filter includes a reception filter, and
the radio-frequency module further includes an IC chip arranged on the second principal surface of the mount board and including a low-noise amplifier configured to amplify a radio-frequency signal that has passed through the reception filter.

6. The radio-frequency module of claim 5, wherein
a first distance between the second principal surface of the mount board and a surface, facing away from the mount board, of the bare-chip acoustic wave filter is shorter than a second distance between the second principal surface of the mount board and a surface, facing away from the mount board, of the IC chip.

7. The radio-frequency module of claim 3, wherein
the bare-chip acoustic wave filter includes a reception filter, and
the radio-frequency module further includes an IC chip arranged on the second principal surface of the mount board and including a low-noise amplifier configured to amplify a radio-frequency signal that has passed through the reception filter.

8. The radio-frequency module of claim 7, wherein
a first distance between the second principal surface of the mount board and a surface, facing away from the mount board, of the bare-chip acoustic wave filter is shorter than a second distance between the second principal surface of the mount board and a surface, facing away from the mount board, of the IC chip.

9. The radio-frequency module of claim 2, further comprising a resin layer arranged on the second principal surface of the mount board and at least partially covering the resin film.

10. The radio-frequency module of claim 9, wherein
the bare-chip acoustic wave filter includes a reception filter, and
the radio-frequency module further includes an IC chip arranged on the second principal surface of the mount board and including a low-noise amplifier configured to amplify a radio-frequency signal that has passed through the reception filter.

11. The radio-frequency module of claim 10, wherein
a first distance between the second principal surface of the mount board and a surface, facing away from the mount board, of the bare-chip acoustic wave filter is shorter than a second distance between the second principal surface of the mount board and a surface, facing away from the mount board, of the IC chip.

12. The radio-frequency module of claim 2, wherein
the bare-chip acoustic wave filter includes a reception filter, and
the radio-frequency module further includes an IC chip arranged on the second principal surface of the mount board and including a low-noise amplifier configured to amplify a radio-frequency signal that has passed through the reception filter.

13. The radio-frequency module of claim 12, wherein
a first distance between the second principal surface of the mount board and a surface, facing away from the mount board, of the bare-chip acoustic wave filter is shorter than a second distance between the second principal surface of the mount board and a surface, facing away from the mount board, of the IC chip.

14. The radio-frequency module of claim 1, further comprising a resin layer arranged on the second principal surface of the mount board and covering an outer peripheral surface of the piezoelectric substrate, wherein the space is surrounded with the bare-chip acoustic wave filter, the second principal surface of the mount board, and the resin layer.

15. The radio-frequency module of claim 1, wherein
the bare-chip acoustic wave filter includes a reception filter, and
the radio-frequency module further includes an IC chip arranged on the second principal surface of the mount board and including a low-noise amplifier configured to amplify a radio-frequency signal that has passed through the reception filter.

16. The radio-frequency module of claim 15, wherein
a first distance between the second principal surface of the mount board and a surface, facing away from the mount board, of the bare-chip acoustic wave filter is shorter than a second distance between the second principal surface of the mount board and a surface, facing away from the mount board, of the IC chip.

17. The radio-frequency module of claim 1, wherein
the bare-chip acoustic wave filter includes a reception filter, and
the radio-frequency module further includes an IC chip arranged on the second principal surface of the mount board and including a low-noise amplifier configured to amplify a radio-frequency signal that has passed through the reception filter.

18. The radio-frequency module of claim 17, wherein
a first distance between the second principal surface of the mount board and a surface, facing away from the mount board, of the bare-chip acoustic wave filter is shorter than a second distance between the second principal surface of the mount board and a surface, facing away from the mount board, of the IC chip.

19. A communications device comprising:
a radio-frequency module; and
a signal processor circuit configured to perform signal processing on a radio-frequency signal passing through the bare-chip acoustic wave filter of the radio-frequency module, wherein the radio-frequency module including
a mount board having a first principal surface on one side of the mount board and a second principal surface on an opposite side of the mount board,
an electronic component arranged on the first principal surface of the mount board,
an external connection terminal arranged on the second principal surface of the mount board, and
a bare-chip acoustic wave filter arranged on the second principal surface of the mount board,
wherein
the bare-chip acoustic wave filter includes:
a piezoelectric substrate having a first principal substrate surface and a second principal substrate surface on opposite sides of the piezoelectric substrate;
an interdigital transducer (IDT) electrode provided on the first principal substrate surface of the piezoelectric substrate; and
a plurality of pad electrodes provided over the first principal substrate surface of the piezoelectric substrate, wherein
the radio-frequency module further includes a plurality of bumps bonded to the plurality of pad electrodes and the mount board, and
the IDT electrode is arranged in a space between the piezoelectric substrate and the mount board by the plurality of pad electrodes, the plurality of bumps, the piezoelectric substrate, and the mount board.

* * * * *